(12) United States Patent
Huang

(10) Patent No.: US 11,069,676 B2
(45) Date of Patent: Jul. 20, 2021

(54) SEMICONDUCTOR DEVICE AND METHOD FOR FABRICATING THE SAME

(71) Applicant: NANYA TECHNOLOGY CORPORATION, New Taipei (TW)

(72) Inventor: Tse-Yao Huang, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/585,461

(22) Filed: Sep. 27, 2019

(65) Prior Publication Data

US 2021/0098447 A1 Apr. 1, 2021

(51) Int. Cl.
| | |
|---|---|
| *H01L 21/00* | (2006.01) |
| *H01L 27/06* | (2006.01) |
| *H01L 29/40* | (2006.01) |
| *H01L 29/78* | (2006.01) |
| *H01L 29/423* | (2006.01) |

(Continued)

(52) U.S. Cl.
CPC .... *H01L 27/0629* (2013.01); *H01L 21/28158* (2013.01); *H01L 28/91* (2013.01); *H01L 29/0847* (2013.01); *H01L 29/165* (2013.01); *H01L 29/401* (2013.01); *H01L 29/42364* (2013.01); *H01L 29/42372* (2013.01); *H01L 29/512* (2013.01); *H01L 29/513* (2013.01); *H01L 29/517* (2013.01); *H01L 29/6656* (2013.01); *H01L 29/7848* (2013.01); *H01L 21/0276* (2013.01); *H01L 21/02529* (2013.01); *H01L 21/02532* (2013.01); *H01L 21/02636* (2013.01); *H01L 21/26513* (2013.01); *H01L 21/31111* (2013.01); *H01L 21/31116* (2013.01); *H01L 21/31144* (2013.01); *H01L 29/1608* (2013.01)

(58) Field of Classification Search
CPC .. H01L 27/0629; H01L 29/517; H01L 29/512
See application file for complete search history.

(56) References Cited

U.S. PATENT DOCUMENTS 8,785,995 B2 * 7/2014 Dubourdieu .......... H01L 29/812
257/295
9,484,924 B2 * 11/2016 Shin ........................ H01L 43/08

(Continued)

*Primary Examiner* — Laura M Menz
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a gate structure comprising a gate bottom insulating layer inwardly positioned, a gate top insulating layer positioned on the gate bottom insulating layer, a gate top conductive layer positioned on the gate top insulating layer, and a gate filler layer positioned on the gate top conductive layer; and a capacitor structure comprising a capacitor bottom insulating layer inwardly positioned, a capacitor bottom conductive layer positioned on the capacitor bottom insulating layer, a capacitor top insulating layer positioned on the capacitor bottom conductive layer, a capacitor top conductive layer positioned on the capacitor top insulating layer, and a capacitor filler layer positioned on the capacitor top conductive layer. The gate bottom insulating layer is formed of a same material as the capacitor bottom insulating layer.

20 Claims, 36 Drawing Sheets

(51) Int. Cl.
*H01L 29/51*     (2006.01)
*H01L 21/28*     (2006.01)
*H01L 29/66*     (2006.01)
*H01L 29/165*    (2006.01)
*H01L 29/08*     (2006.01)
*H01L 49/02*     (2006.01)
*H01L 29/16*      (2006.01)
*H01L 21/265*     (2006.01)
*H01L 21/027*     (2006.01)
*H01L 21/311*     (2006.01)
*H01L 21/02*      (2006.01)

(56) References Cited

U.S. PATENT DOCUMENTS

| | | | |
|---|---|---|---|
| 9,536,992 B2 * | 1/2017 | van Bentum | H01L 21/823462 |
| 9,608,110 B2 * | 3/2017 | Baars | H01L 21/28185 |
| 2016/0035856 A1 * | 2/2016 | van Bentum | H01L 29/6684 |
| | | | 257/295 |
| 2017/0338350 A1 * | 11/2017 | Flachowsky | H01L 29/517 |
| 2018/0226417 A1 * | 8/2018 | Ando | H01L 29/0649 |
| 2020/0013897 A1 * | 1/2020 | Park | H01L 21/82345 |

* cited by examiner

SEMICONDUCTOR DEVICE AND METHOD FOR FABRICATING THE SAME

TECHNICAL FIELD

The present disclosure relates to a semiconductor device and a method for fabricating the semiconductor device, and more particularly, to a semiconductor device with concurrently-formed gate structure and capacitor structure and a method for fabricating the semiconductor device with concurrently-formed gate structure and capacitor structure.

DISCUSSION OF THE BACKGROUND

Semiconductor devices are used in a variety of electronic applications, such as personal computers, cell phones, digital cameras, and other electronic equipment. The dimensions of semiconductor devices are continuously being scaled down to meet the demand for increasing computing ability. However, a variety of issues arise during the scaling-down process and the complexity of fabricating such semiconductor devices is continuously increasing. Therefore, challenges remain in achieving improved quality, quality, yield, performance and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first gate structure comprising a first gate bottom insulating layer inwardly positioned, a first gate top insulating layer positioned on the first gate bottom insulating layer, a first gate top conductive layer positioned on the first gate top insulating layer, and a first gate filler layer positioned on the first gate top conductive layer; and a capacitor structure comprising a capacitor bottom insulating layer inwardly positioned, a capacitor bottom conductive layer positioned on the capacitor bottom insulating layer, a capacitor top insulating layer positioned on the capacitor bottom conductive layer, a capacitor top conductive layer positioned on the capacitor top insulating layer, and a capacitor filler layer positioned on the capacitor top conductive layer. The first gate bottom insulating layer is formed of a same material as the capacitor bottom insulating layer.

In some embodiments, the semiconductor device further comprises a second gate structure positioned adjacent to the first gate structure.

In some embodiments, the second gate structure comprises a second gate bottom insulating layer inwardly positioned, a second gate bottom conductive layer positioned on the second gate bottom insulating layer, a second gate top conductive layer positioned on the second gate bottom conductive layer, and a second gate filler layer positioned on the second gate top conductive layer, wherein the second gate bottom insulating layer is formed of a same material as the first gate bottom insulating layer.

In some embodiments, the semiconductor device further comprises a substrate and a first insulating film positioned on the substrate, wherein the first gate structure, the second gate structure, and the capacitor structure are positioned in the first insulating film.

In some embodiments, the semiconductor device further comprises an isolation layer positioned in the substrate and defining a first active region, a second active region positioned adjacent to the first active region, and a third active region positioned adjacent to the second active region.

In some embodiments, the semiconductor device further comprises a plurality of first doped subregions positioned in the first active region and respectively adjacent to two sides of a bottom of the first gate structure.

In some embodiments, the semiconductor device further comprises a plurality of first stress regions respectively positioned adjacent to the plurality of first doped subregions.

In some embodiments, the second gate structure further comprises a second gate top insulating layer positioned between the second gate bottom conductive layer and second gate top conductive layer.

In some embodiments, a thickness of the second gate top insulating layer is less than or equal to a thickness of the first gate top insulating layer.

In some embodiments, a thickness of the first gate bottom insulating layer is the same as a thickness of the capacitor bottom insulating layer.

In some embodiments, a thickness of the first gate top insulating layer is the same as a thickness of the capacitor top insulating layer, and the first gate top insulating layer is formed of a same material as the capacitor top insulating layer.

In some embodiments, a thickness of the first gate top conductive layer is the same as a thickness of the capacitor top conductive layer, and the first gate top conductive layer is formed of a same material as the capacitor top conductive layer.

In some embodiments, the semiconductor device further comprises a substrate, wherein the first gate structure, the second gate structure, and the capacitor structure are positioned in the substrate.

Another aspect of the present disclosure provides a method for fabricating a semiconductor device including concurrently forming a first gate structure and a capacitor structure. The first gate structure comprises a first gate bottom insulating layer inwardly positioned, a first gate top insulating layer positioned on the first gate bottom insulating layer, a first gate top conductive layer positioned on the first gate top insulating layer, and a first gate filler layer positioned on the first gate top conductive layer; and the capacitor structure comprises a capacitor bottom insulating layer inwardly positioned, a capacitor bottom conductive layer positioned on the capacitor bottom insulating layer, a capacitor top insulating layer positioned on the capacitor bottom conductive layer, a capacitor top conductive layer positioned on the capacitor top insulating layer, and a capacitor filler layer positioned on the capacitor top conductive layer. The first gate bottom insulating layer is formed of a same material as the capacitor bottom insulating layer.

In some embodiments, the method for fabricating the semiconductor device further comprises: forming a second gate structure concurrently with the first gate structure and the capacitor structure, wherein the second gate structure is positioned adjacent to the first gate structure.

In some embodiments, the second gate structure comprises a second gate bottom insulating layer inwardly positioned, a second gate bottom conductive layer positioned on the second gate bottom insulating layer, a second gate top conductive layer positioned on the second gate bottom conductive layer, and a second gate filler layer positioned on the second gate top conductive layer; wherein the second gate bottom insulating layer is formed of a same material as the first gate bottom insulating layer.

In some embodiments, the method for fabricating the semiconductor device further comprises: a substrate and a first insulating film positioned on the substrate, wherein the first gate structure, the second gate structure, and the capacitor structure are positioned in the first insulating film.

In some embodiments, the method for fabricating the semiconductor device further comprises: a substrate, wherein the first gate structure, the second gate structure, and the capacitor structure are positioned in the substrate.

In some embodiments, a thickness of the first gate bottom insulating layer is the same as a thickness of the capacitor bottom insulating layer.

In some embodiments, a thickness of the first gate top insulating layer is the same as a thickness of the capacitor top insulating layer, and the first gate top insulating layer is formed of a same material as the capacitor top insulating layer.

According to the design of the semiconductor device of the present disclosure, the thickness and the materials for elements of the first gate structure, the second gate structure, and the capacitor structure may be the same; therefore, such elements may be concurrently fabricated. As a result, a complexity of fabricating the semiconductor device may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
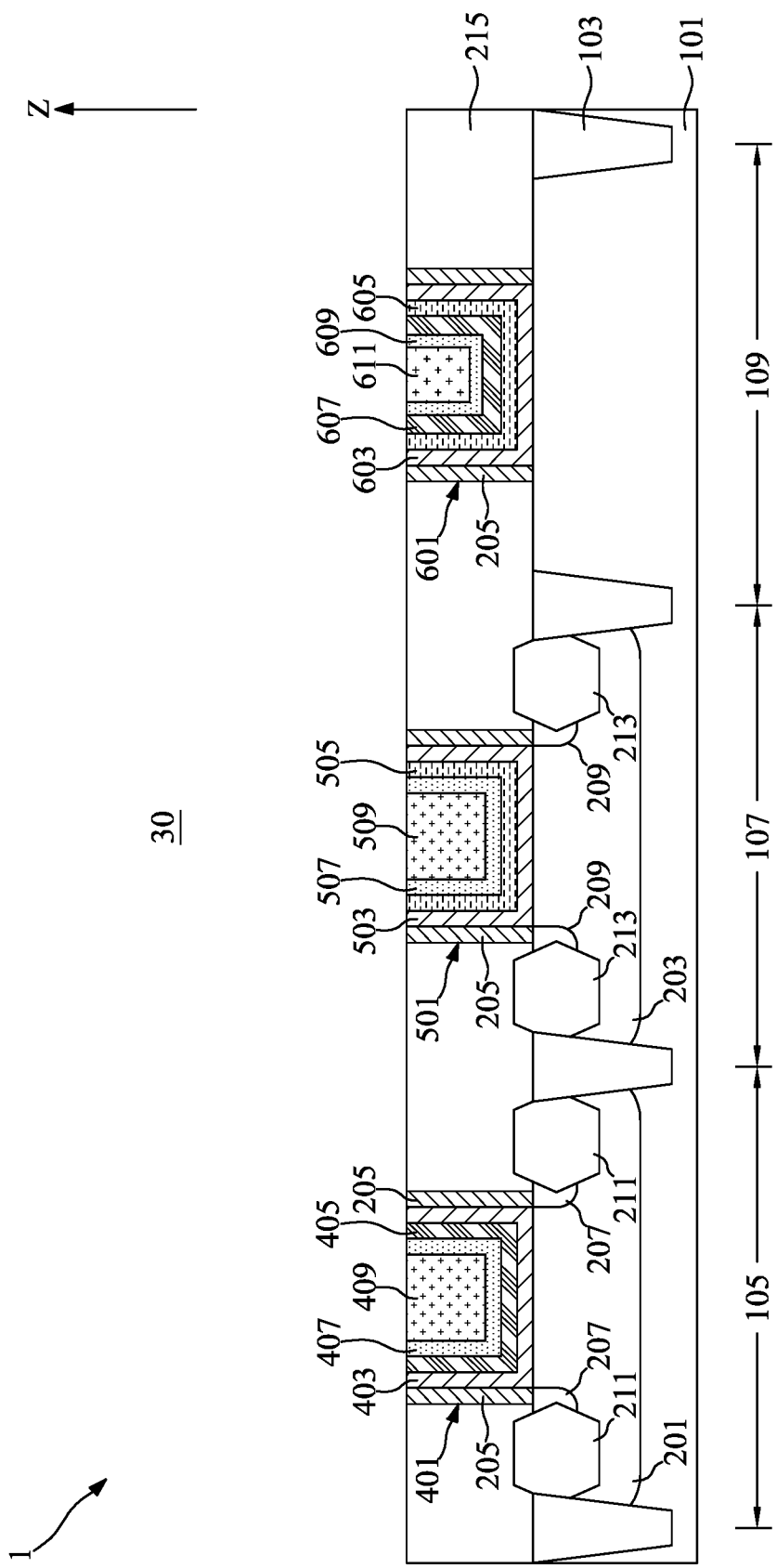
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element or layer is referred to as being "connected to," or "coupled to" another element or layer, it can be directly connected to or coupled to another element or layer or intervening elements or layers may be present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
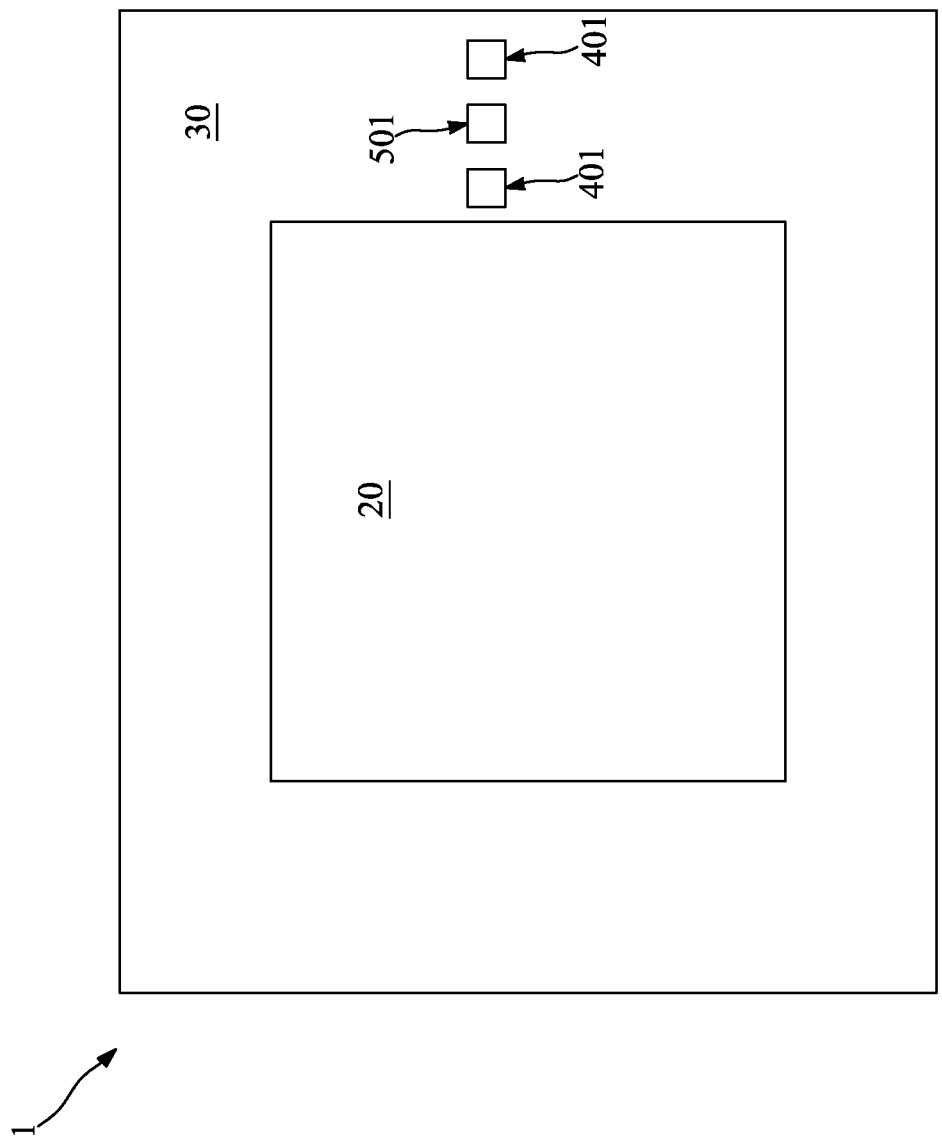
FIG. 2 illustrates, in a schematic top-view diagram, the semiconductor device in accordance with FIG. 1.

FIG. 1 illustrates, in a schematic cross-sectional view diagram, a semiconductor device in accordance with one embodiment of the present disclosure. FIG. 2 illustrates, in a schematic top-view diagram, the semiconductor device in accordance with FIG. 1.

A semiconductor device 1 in accordance with one embodiment of the present disclosure may include a substrate 101, an isolation layer 103, a plurality of well regions, a plurality of doped subregions, a plurality of stress regions, a plurality of spacers 205, a first gate structure 401, a second gate structure 501, and a capacitor structure 601.

With reference to FIGS. 1 and 2, in the embodiment depicted, the substrate 101 may include an array area 20 and a peripheral area 30. The array area 20 may be disposed in center of the substrate 101 as seen in the top-view diagram in FIG. 2. The peripheral area 30 may be disposed surrounding the array area 20. The substrate 101 may be formed of silicon, silicon germanium, gallium arsenic, or other suitable semiconductor materials. In addition, the substrate 101 may be a semiconductor on insulator such as silicon on insulator.

With reference to FIGS. 1 and 2, in the embodiment depicted, the isolation layer 103 may be disposed in the substrate 101. (Four isolation layers 103 are shown in the cross-sectional diagram in FIG. 1, but other quantities of isolation layers may be used in other embodiments.) The isolation layer 103 may be formed of, for example, an insulating material such as silicon oxide, silicon nitride, silicon oxynitride, silicon nitride oxide, or fluoride-doped silicate. The isolation layer 103 may define a plurality of active regions of the substrate 101. The plurality of active regions may include a first active region 105, a second active region 107, and a third active region 109. The first active region 105, the second active region 107, and the third active region 109 may be disposed at the peripheral area 30. The first active region 105 and the second active region 107 may be disposed next to each other. The third active region 109 may be disposed adjacent to the second active region 107. Alternatively, in another embodiment, the third active region 109 may be disposed adjacent to the first active region 105 or separated from the second active region 107 or the first active region 105.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 1 and 2, in the embodiment depicted, the plurality of well regions may be disposed in the substrate 101. Specifically, the plurality of well regions may be disposed in the first active region 105 and the second active region 107, respectively. The plurality of well regions may include a first well 201 and a second well 203. The first well 201 may be disposed in the first active region 105 of the substrate 101. The first well 201 may be doped with a dopant such as boron. The second well 203 may be disposed in the second active region 107 of the substrate 101. The second well 203 may be doped with a dopant such as phosphorus, arsenic, or antimony.

With reference to FIGS. 1 and 2, in the embodiment depicted, a first insulating film 215 may be disposed on the substrate 101. The first insulating film 215 may be formed of, for example, silicon nitride, silicon oxide, silicon oxynitride, undoped silica glass, borosilica glass, phosphosilica glass, borophosphosilica glass, fluoride silicate glass, carbon-doped silicon oxide, or a combination thereof, but is not limited thereto.

With reference to FIGS. 1 and 2, in the embodiment depicted, the first gate structure 401 may be disposed in the first insulating film 215 and above the first active region 105 of the substrate 101. A bottom of the first gate structure 401 may directly contact a top surface of the substrate 101. The first g ate structure 401 may include a first gate bottom insulating layer 403, a first gate top insulating layer 405, a first gate top conductive layer 407, and a first gate filler layer 409.

With reference to FIGS. 1 and 2, in the embodiment depicted, the first gate bottom insulating layer 403 may be inwardly disposed in the first insulating film 215 and above the first active region 105. A bottom of the first gate bottom insulating layer 403 may directly contact the top surface of the substrate 101. A thickness of the first gate bottom insulating layer 403 may be between about 0.5 nm and about 5.0 nm. Preferably, the thickness of the first gate bottom insulating layer 403 may be between about 0.5 nm and about 2.5 nm. However, the thickness of the first gate bottom insulating layer 403 may be set to an arbitrary range depending on the circumstances.

The first gate bottom insulating layer 403 may be formed of an insulating material having a dielectric constant of about 4.0 or greater. (All dielectric constants mentioned herein are relative to a vacuum unless otherwise noted.) The insulating material having a dielectric constant of about 4.0 or greater may be hafnium oxide, hafnium zirconium oxide, hafnium lanthanum oxide, hafnium silicon oxide, hafnium tantalum oxide, hafnium titanium oxide, zirconium oxide, aluminum oxide, aluminum silicon oxide, titanium oxide, tantalum pentoxide, lanthanum oxide, lanthanum silicon oxide, strontium titanate, lanthanum aluminate, yttrium oxide, gallium (III) trioxide, gadolinium gallium oxide, lead zirconium titanate, barium titanate, barium strontium titanate, barium zirconate, or a mixture thereof. Alternatively, in another embodiment, the insulating material may be silicon oxide, silicon nitride, silicon oxynitride, silicon nitride oxide, or the like.

In addition, an interfacial layer (not shown) may be disposed between the top surface of the substrate 101 and the first gate bottom insulating layer 403 and between the first insulating film 215 and the first gate bottom insulating layer 403. The interfacial layer may improve the interfacial properties between the first gate bottom insulating layer 403 and the substrate 101 and between the first gate bottom insulating layer 403 and the first insulating film 215. The interfacial layer may be formed of, for example, silicon oxide. A thickness of the interfacial layer may be between about 5 angstroms and about 20 angstroms.

With reference to FIGS. 1 and 2, in the embodiment depicted, the first gate top insulating layer 405 may be disposed on the first gate bottom insulating layer 403. The first gate top insulating layer 405 may be formed of, for example, silicon oxide, silicon nitride, silicon oxynitride, silicon nitride oxide, or the like. The first gate top insulating layer 405 formed of silicon oxide and disposed on the first gate bottom insulating layer 403 formed of the insulating material having a dielectric constant of about 4.0 or greater may reduce electric field at the top surface of the substrate 101; therefore, leakage current may be reduced. Alternatively, in another embodiment, the first gate top insulating layer 405 may be formed of an insulating material having a dielectric constant of about 4.0 or greater.

With reference to FIGS. 1 and 2, in the embodiment depicted, the first gate top conductive layer 407 may be disposed on the first gate top insulating layer 405. The first gate top conductive layer 407 may be formed of a material including titanium, titanium nitride, aluminum, titanium aluminum, titanium aluminum nitride, tantalum nitride, tantalum carbide, tantalum carbonitride, tantalum silicon nitride, zirconium, or manganese. A thickness of the first gate top conductive layer 407 may be between about 10 angstroms and about 200 angstroms. Preferably, the thickness of the first gate top conductive layer 407 may be between about 10 angstroms and about 100 angstroms.

With reference to FIGS. 1 and 2, in the embodiment depicted, the first gate filler layer 409 may be disposed on the first gate top conductive layer 407. A top surface of the first gate filler layer 409 may be even with a top surface of the first insulating film 215. The first gate filler layer 409 may be formed of a conductive material such as tungsten or aluminum.

With reference to FIGS. 1 and 2, in the embodiment depicted, the second gate structure 501 may be disposed in the first insulating film 215 and above the second active region 107 of the substrate 101. The second gate structure 501 may be disposed adjacent to the first gate structure 401. A bottom of the second gate structure 501 may directly contact the top surface of the substrate 101. The second gate structure 501 may include a second gate bottom insulating layer 503, a second gate bottom conductive layer 505, a second gate top conductive layer 507, and a second gate filler layer 509.

With reference to FIGS. 1 and 2, in the embodiment depicted, the second gate bottom insulating layer 503 may be inwardly disposed in the first insulating film 215 and above the second active region 107. A bottom of the second gate bottom insulating layer 503 may directly contact the top surface of the substrate 101. The second gate bottom insulating layer 503 may have a same thickness as the first gate bottom insulating layer 403. The second gate bottom insulating layer 503 may be formed of a same material as the first gate bottom insulating layer 403.

In addition, an interfacial layer (not shown) may be disposed between the top surface of the substrate 101 and the second gate bottom insulating layer 503 and between the first insulating film 215 and the second gate bottom insulating layer 503. The interfacial layer may improve the interfacial properties between the second gate bottom insulating layer 503 and the substrate 101 and between the second gate bottom insulating layer 503 and the first insulating film 215. The interfacial layer may be formed of, for example, silicon oxide. A thickness of the interfacial layer may be between about 5 angstroms and about 20 angstroms.

With reference to FIGS. 1 and 2, in the embodiment depicted, the second gate bottom conductive layer 505 may be disposed on the second gate bottom insulating layer 503. The second gate bottom conductive layer 505 may be formed of a material including titanium nitride, tantalum nitride, tantalum carbide, tungsten nitride, or ruthenium. A thickness of the second gate bottom conductive layer 505 may be between about 10 angstroms and about 100 angstroms.

With reference to FIGS. 1 and 2, in the embodiment depicted, the second gate top conductive layer 507 may be disposed on the second gate bottom conductive layer 505. The second gate bottom conductive layer 505 may be formed of a same material as the first gate top conductive layer 407. A thickness of the second gate top conductive layer 507 may be the same as the thickness of the first gate top conductive layer 407. The second gate filler layer 509 may be disposed on the second gate top conductive layer 507. The second gate filler layer 509 may be formed of a same material as the first gate filler layer 409.

With reference to FIGS. 1 and 2, in the embodiment depicted, the capacitor structure 601 may be disposed in the first insulating film 215 and above the third active region 109 of the substrate 101. The capacitor structure 601 may be disposed adjacent to the second gate structure 501. A bottom of the capacitor structure 601 may directly contact the top surface of the substrate 101. The capacitor structure 601 may include a capacitor bottom insulating layer 603, a capacitor bottom conductive layer 605, a capacitor top insulating layer 607, a capacitor top conductive layer 609, and a capacitor filler layer 611.

With reference to FIGS. 1 and 2, in the embodiment depicted, the capacitor bottom insulating layer 603 may be inwardly disposed in the first insulating film 215 and above the third active region 109. A bottom of the capacitor bottom insulating layer 603 may directly contact the top surface of the substrate 101. A thickness of the capacitor bottom insulating layer 603 may the same as the thickness of the first gate bottom insulating layer 403 and the thickness of the second gate bottom insulating layer 503. The capacitor top conductive layer 609 may be formed of a same material as the first gate bottom insulating layer 403 and the second gate bottom insulating layer 503. The first gate bottom insulating layer 403, the second gate bottom insulating layer 503, and the capacitor bottom insulating layer 603 may be formed concurrently from a layer formed of an insulating material having a dielectric constant of about 4.0 or greater.

In addition, an interfacial layer (not shown) may be disposed between the top surface of the substrate 101 and the capacitor bottom insulating layer 603 and between the first insulating film 215 and the capacitor bottom insulating layer 603. The interfacial layer may improve the interfacial properties between the capacitor bottom insulating layer 603 and the substrate 101 and between the capacitor bottom insulating layer 603 and the first insulating film 215. The interfacial layer may be formed of, for example, silicon oxide. A thickness of the interfacial layer may be between about 5 angstroms and about 20 angstroms.

With reference to FIGS. 1 and 2, in the embodiment depicted, the capacitor bottom conductive layer 605 may be disposed on the capacitor bottom insulating layer 603. The capacitor bottom conductive layer 605 may be formed of a same material as the second gate bottom conductive layer 505. A thickness of the capacitor bottom conductive layer 605 may be the same as the thickness of the second gate bottom conductive layer 505. The second gate bottom conductive layer 505 and the capacitor bottom conductive layer 605 may be formed concurrently from a layer formed of a material including titanium nitride, tantalum nitride, tantalum carbide, tungsten nitride, or ruthenium.

With reference to FIGS. 1 and 2, in the embodiment depicted, the capacitor top insulating layer 607 may be disposed on the capacitor bottom conductive layer 605. The capacitor top insulating layer 607 may be formed of a same material as the first gate top insulating layer 405. A thickness of the capacitor top insulating layer 607 may be the same as a thickness of the first gate top insulating layer 405. The first gate top insulating layer 405 and the capacitor top insulating layer 607 may formed concurrently from a layer formed of silicon oxide, silicon nitride, silicon oxynitride, silicon nitride oxide, or the like.

With reference to FIGS. 1 and 2, in the embodiment depicted, the capacitor top conductive layer 609 may be disposed on the capacitor top insulating layer 607. The capacitor top conductive layer 609 may be formed of a same material as the first gate top conductive layer 407 and the second gate top conductive layer 507. A thickness of the capacitor top conductive layer 609 may be the same as the thickness of the first gate top conductive layer 407 and the thickness of the second gate top conductive layer 507. The first gate top conductive layer 407, the second gate top conductive layer 507, and the capacitor top conductive layer 609 may be formed concurrently from a layer formed of a material including titanium, titanium nitride, aluminum, titanium aluminum, titanium aluminum nitride, tantalum nitride, tantalum carbide, tantalum carbonitride, tantalum silicon nitride, zirconium, or manganese. The capacitor structure 601 may serve as a decoupling capacitor.

With reference to FIGS. 1 and 2, in the embodiment depicted, the plurality of spacers 205 may be disposed in the first insulating film 215 and respectively correspondingly attached to two sides of the first gate structure 401, two sides of the second gate structure 501, and two sides of the capacitor structure 601. Specifically, the plurality of spacers 205 may be respectively correspondingly attached to outer surfaces of the first gate bottom insulating layer 403, the second gate bottom insulating layer 503, and the capacitor bottom insulating layer 603. The plurality of spacers 205 may be formed of, for example, silicon oxide, silicon nitride, silicon oxynitride, silicon nitride oxide, or the like.

With reference to FIGS. 1 and 2, in the embodiment depicted, the plurality of doped subregions may be disposed in the first active region 105 and the second active region 107 of the substrate 101. Specifically, the plurality of doped subregions may include a plurality of first doped subregions 207 and a plurality of second doped subregions 209. The plurality of first doped subregions 207 may be disposed in the first active region 105 and respectively correspondingly disposed below the plurality of spacers 205 attached to the two sides of the first gate structure 401. The plurality of first doped subregions 207 may be disposed adjacent to two sides of the bottom of the first gate structure 401. The plurality of first doped subregions 207 may be doped with a dopant such as phosphorus, arsenic, or antimony.

With reference to FIGS. 1 and 2, in the embodiment depicted, the plurality of second doped subregions 209 may be disposed in the second active region 107 and respectively correspondingly disposed below the plurality of spacers 205 attached to the two sides of the second gate structure 501. The plurality of second doped subregions 209 may be disposed adjacent to two sides of the bottom of the second gate structure 501. The plurality of second doped subregions 209 may be doped with a dopant such as boron. Dopant concentrations of the plurality of first doped subregions 207 and the plurality of second doped subregions 209 may be greater than dopant concentrations of the first well 201 and the second well 203. The plurality of first doped subregions 207 and the plurality of second doped subregions 209 may alleviate hot-electron effect.

With reference to FIGS. 1 and 2, in the embodiment depicted, the plurality of stress regions may be disposed in the first active region 105 and the second active region 107 of the substrate 101. Specifically, the plurality of stress regions may include a plurality of first stress regions 211 and a plurality of second stress regions 213. The plurality of first stress regions 211 may be disposed in the first active region 105 of the substrate 101 and respectively correspondingly adjacent to the plurality of first doped subregions 207. The plurality of second stress regions 213 may be disposed in the second active region 107 of the substrate 101 and respectively correspondingly adjacent to the plurality of second doped subregions 209. The plurality of first stress regions 211 and the plurality of second stress regions 213 may have lattice constants different from that of the substrate 101. The plurality of first stress regions 211 may be formed of, for example, silicon carbide. The plurality of second stress regions 213 may be formed of, for example, silicon germanium. The plurality of first stress regions 211 and the plurality of second stress regions 213 may increase the carrier mobility of the semiconductor device 1.

FIGS. 3 to 7 illustrate, in schematic cross-sectional view diagrams, semiconductor devices in accordance with some embodiments of the present disclosure.

Figure 3:
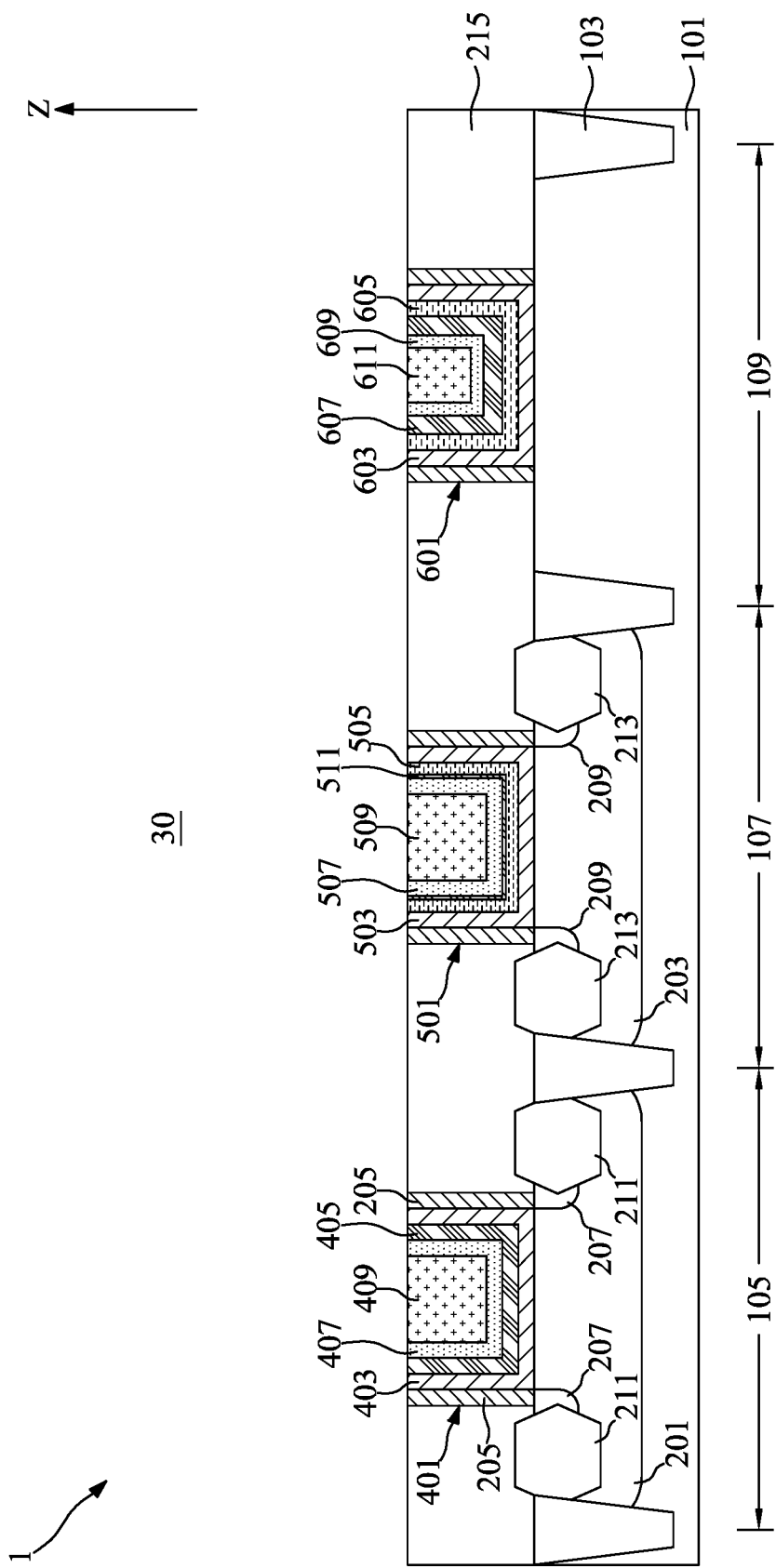
FIGS. 3 to 7 illustrate, in schematic cross-sectional view diagrams, semiconductor devices in accordance with some embodiments of the present disclosure.

With reference to FIG. 3, the second gate structure 501 may further include a second gate top insulating layer 511. The second gate top insulating layer 511 may be disposed between the second gate bottom conductive layer 505 and the second gate top conductive layer 507. The second gate bottom conductive layer 505 may be formed of a same material as the first gate top insulating layer 405 and the capacitor top insulating layer 607. A thickness of the second gate top insulating layer 511 may be less than the thickness of the first gate top insulating layer 405 and the capacitor top insulating layer 607. The first gate top insulating layer 405, the capacitor top insulating layer 607, and the second gate top insulating layer 511 may be formed concurrently from the layer formed of silicon oxide, silicon nitride, silicon oxynitride, silicon nitride oxide, or the like. A gas treatment including hydrogen may be subsequently performed on the second gate top insulating layer 511 to reduce the thickness of the second gate top insulating layer 511. Alternatively, an etch process may be subsequently performed on the second gate top insulating layer 511 to reduce the thickness of the second gate top insulating layer 511.

Figure 4:
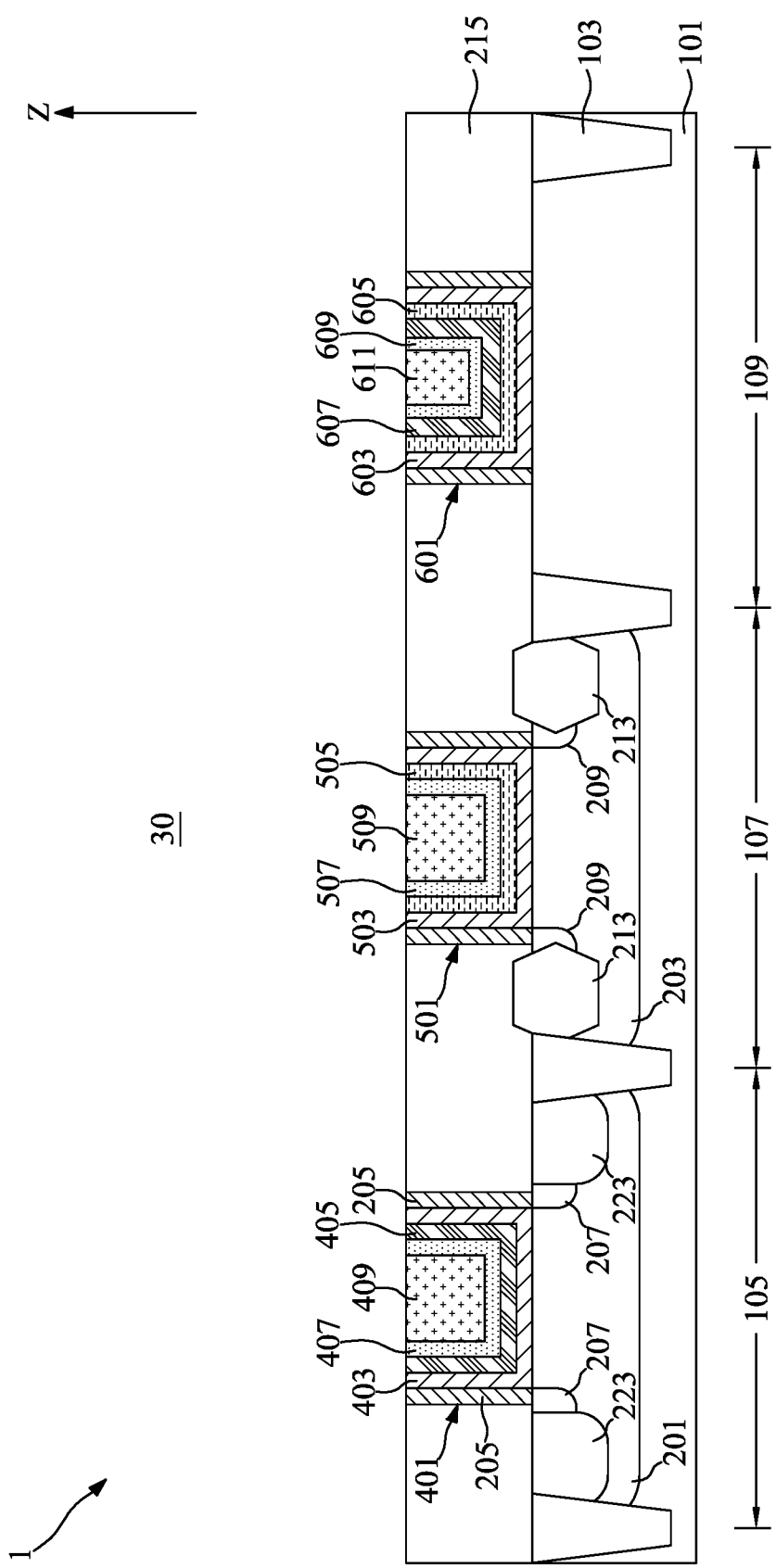

With reference to FIG. 4, the semiconductor device 1 may alternatively include a plurality of first heavily-doped regions 223. The plurality of first heavily-doped regions 223 may be disposed in the first active region 105 of the substrate 101 and respectively correspondingly adjacent to the plurality of first doped subregions 207. Bottoms of the plurality of first heavily-doped regions 223 may be at a vertical level lower than a vertical level of bottoms of the plurality of first doped subregions 207. The plurality of first heavily-doped regions 223 may be doped with a dopant such as phosphorus, arsenic, or antimony. A dopant concentration of the plurality of first heavily-doped regions 223 may be greater than the dopant concentration of the plurality of first doped subregions 207.

Figure 5:
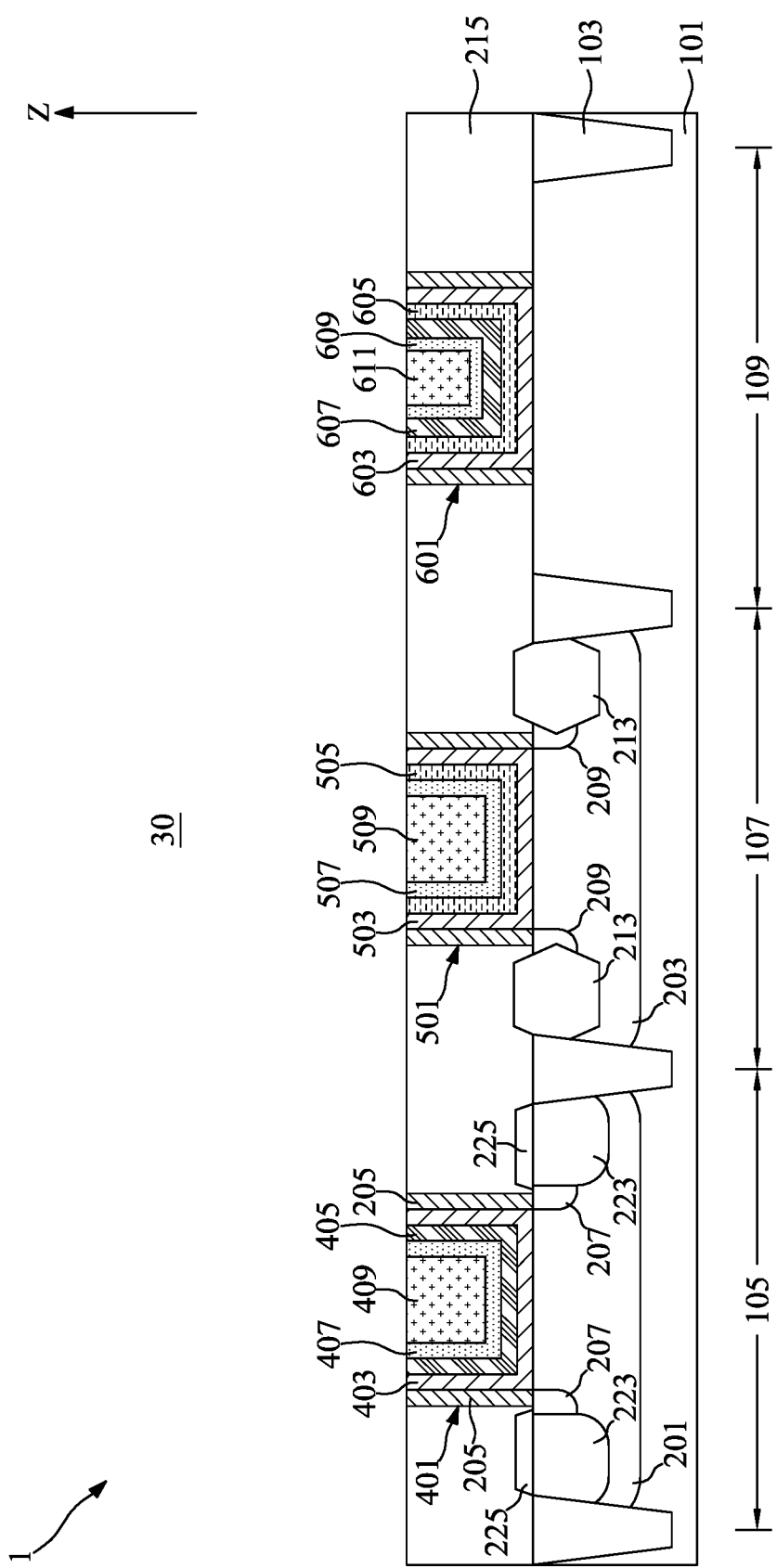

With reference to FIG. 5, the semiconductor device 1 may include a plurality of epitaxial regions 225. The plurality of epitaxial regions 225 may be disposed in the first insulating film 215 and respectively correspondingly on the plurality of first heavily-doped regions 223. The plurality of epitaxial regions 225 may be respectively correspondingly disposed next to the plurality of spacers 205. The plurality of epitaxial regions 225 may have a lattice constant different from that of the substrate 101. The plurality of epitaxial regions 225 may be formed of, for example, silicon carbide.

Figure 6:
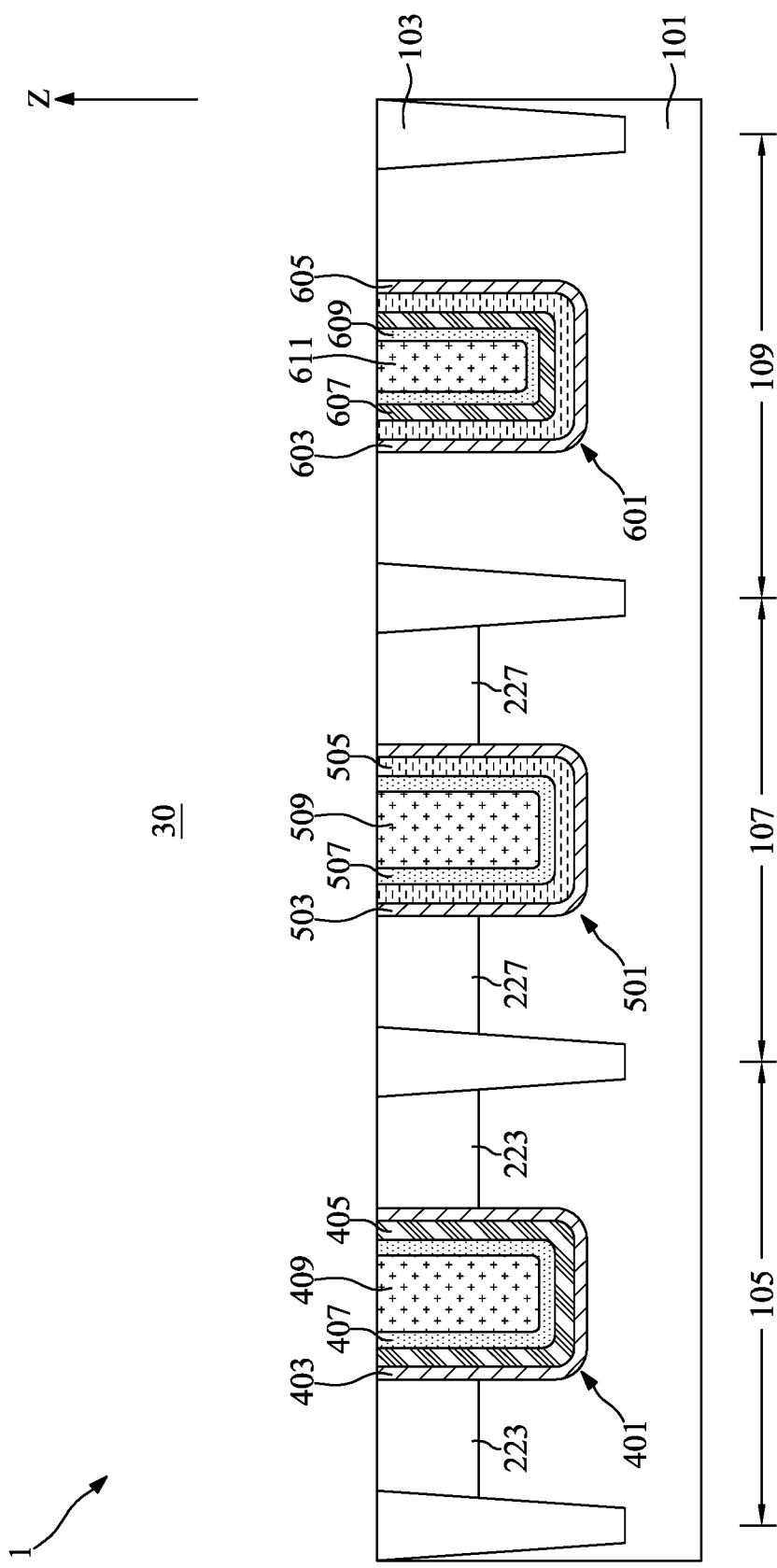

With reference to FIG. 6, alternatively, in another embodiment, the first gate structure 401, the second gate structure 501, and the capacitor structure 601 may be disposed in the substrate 101. Specifically, the first gate structure 401 may be disposed in the first active region 105, the second gate structure 501 may be disposed in the second active region 107, and the capacitor structure 601 may be disposed in the third active region 109. The plurality of first heavily-doped regions 223 may be respectively correspondingly disposed adjacent to two sides of the first gate structure 401. A plurality of second heavily-doped regions 227 may be respectively correspondingly disposed adjacent to two sides of the second gate structure 501. The plurality of second heavily-doped regions 227 may be doped with a dopant such as boron.

Figure 7:
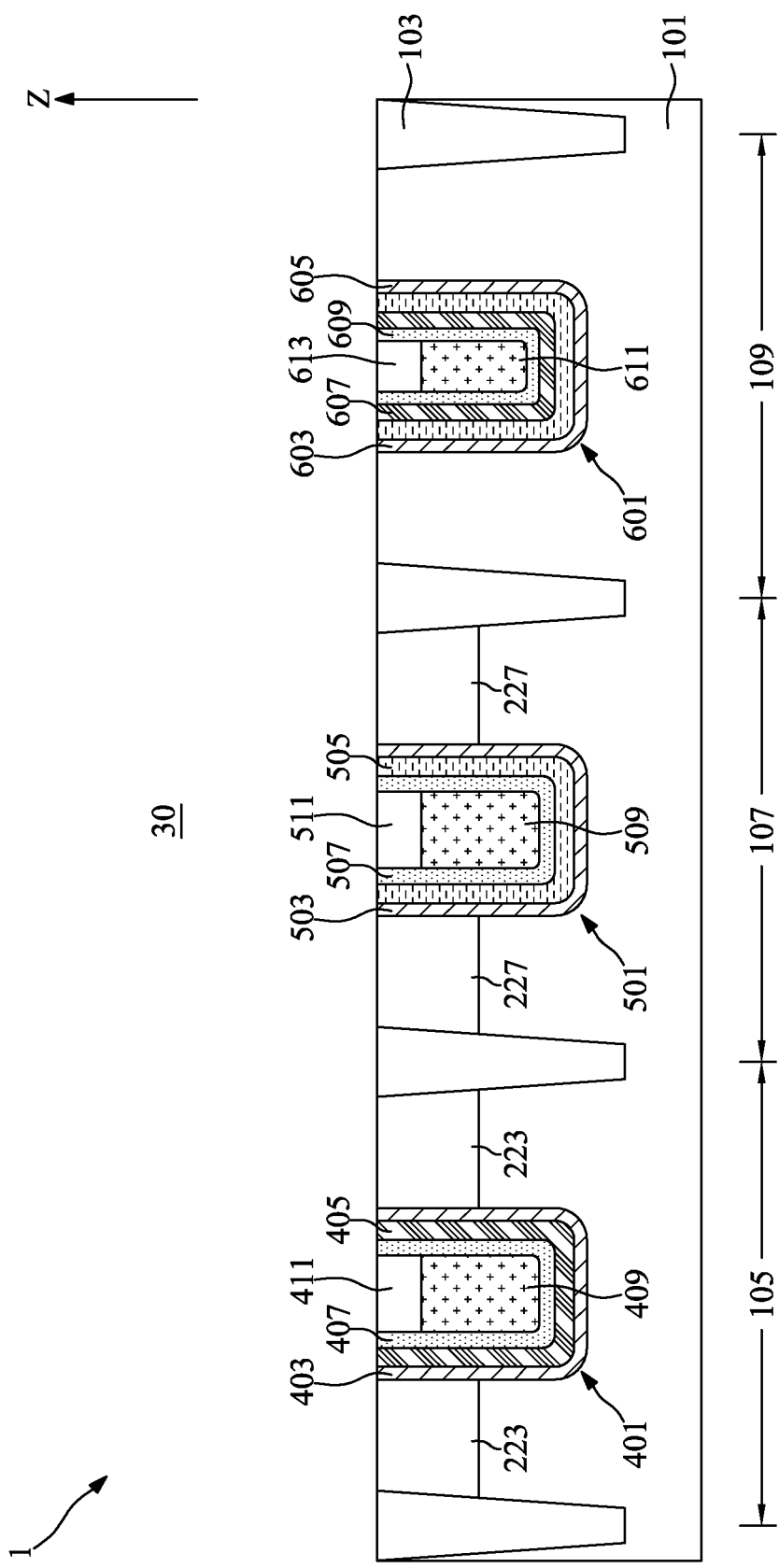

With reference to FIG. 7, the first gate structure 401 may include a first gate capping layer 411, the second gate structure 501 may include a second gate capping layer 513, and the capacitor structure 601 may include a capacitor capping layer 613. The first gate capping layer 411 may be disposed on the first gate filler layer 409. A top surface of the first gate capping layer 411 may be even with the top surface of the substrate 101. The second gate capping layer 513 may be disposed on the second gate filler layer 509. A top surface of the second gate capping layer 513 may be even with the top surface of the substrate 101. The capacitor capping layer 613 may be disposed on the capacitor filler layer 611. A top surface of the capacitor capping layer 613 may be even with the top surface of the substrate 101. The first gate capping layer 411, the second gate capping layer 513, and the capacitor capping layer 613 may be formed of, for example, silicon oxide, silicon nitride, silicon oxynitride, silicon nitride oxide, or the like. The first gate capping layer 411, the second gate capping layer 513, and the capacitor capping layer 613 may be formed concurrently from a layer formed of silicon oxide, silicon nitride, silicon oxynitride, silicon nitride oxide, or the like.

Figure 8:
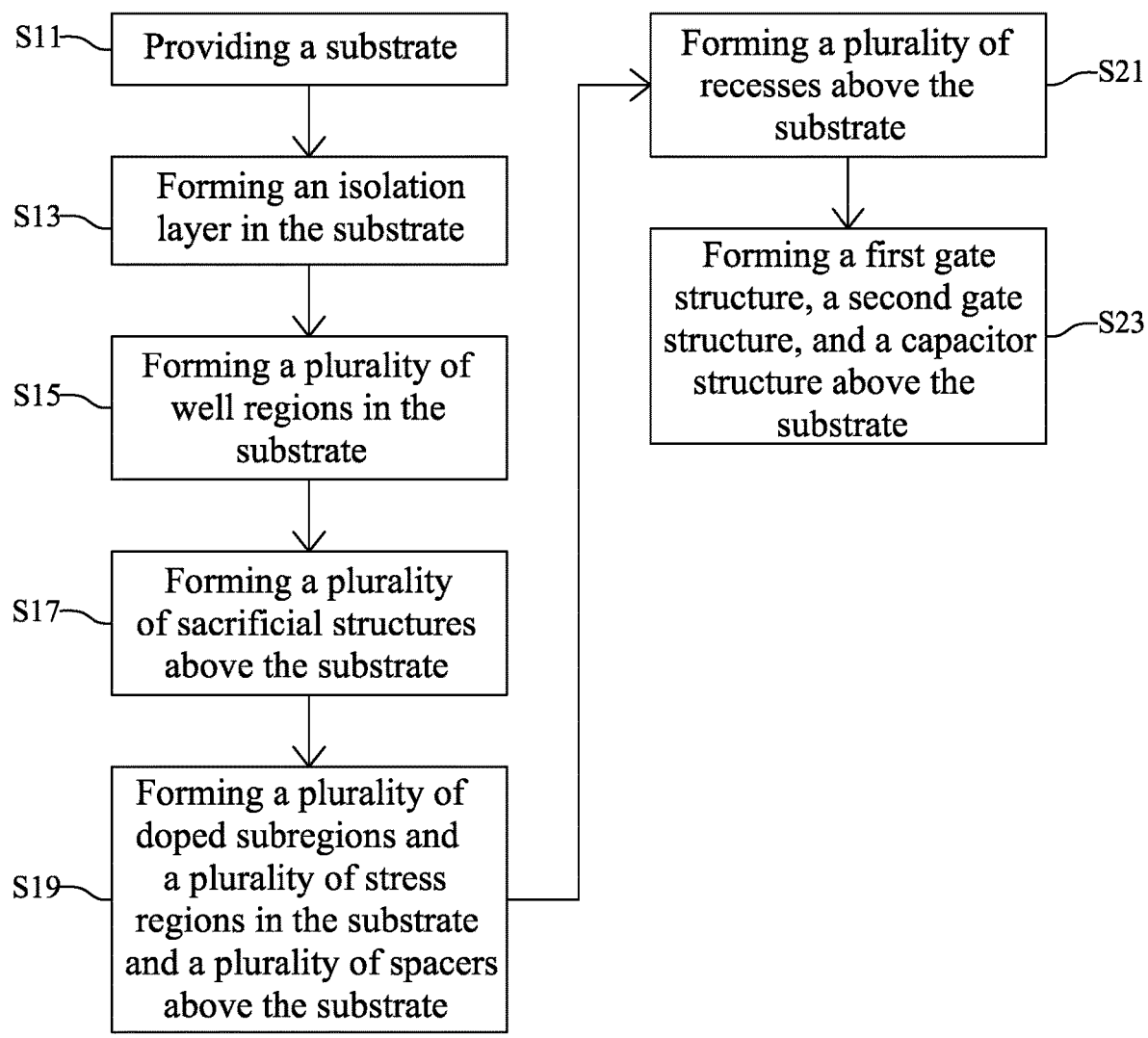
FIG. 8 illustrates, in a flowchart diagram form, a method for fabricating a semiconductor device in accordance with one embodiment of the present disclosure.

FIG. 8 illustrates, in a flowchart diagram form, a method 10 for fabricating a semiconductor device 1 in accordance with one embodiment of the present disclosure. FIGS. 9 to 33 illustrate, in schematic cross-sectional diagrams, a flow of fabricating a semiconductor device 1 in accordance with one embodiment of the present disclosure.

Figure 9:
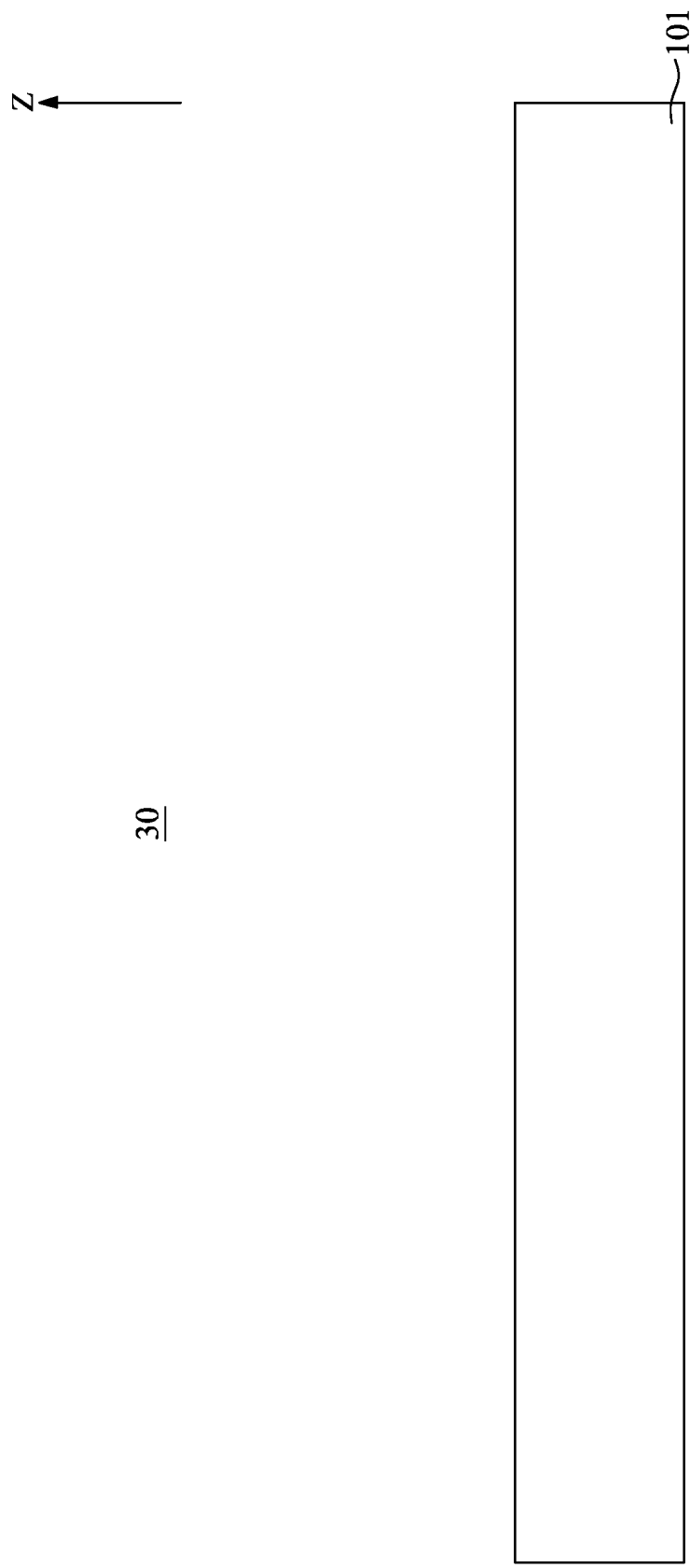
FIGS. 9 to 33 illustrate, in schematic cross-sectional diagrams, a flow of fabricating a semiconductor device in accordance with one embodiment of the present disclosure.

With reference to FIGS. 8 and 9, at step S11, in the embodiment depicted, a substrate 101 may be provided. The substrate 101 may include an array area 20 and a peripheral area 30. The array area 20 may be disposed in a center of the substrate 101 as seen in a top-view diagram. The peripheral area 30 may be disposed surrounding the array area 20.

Figure 10:
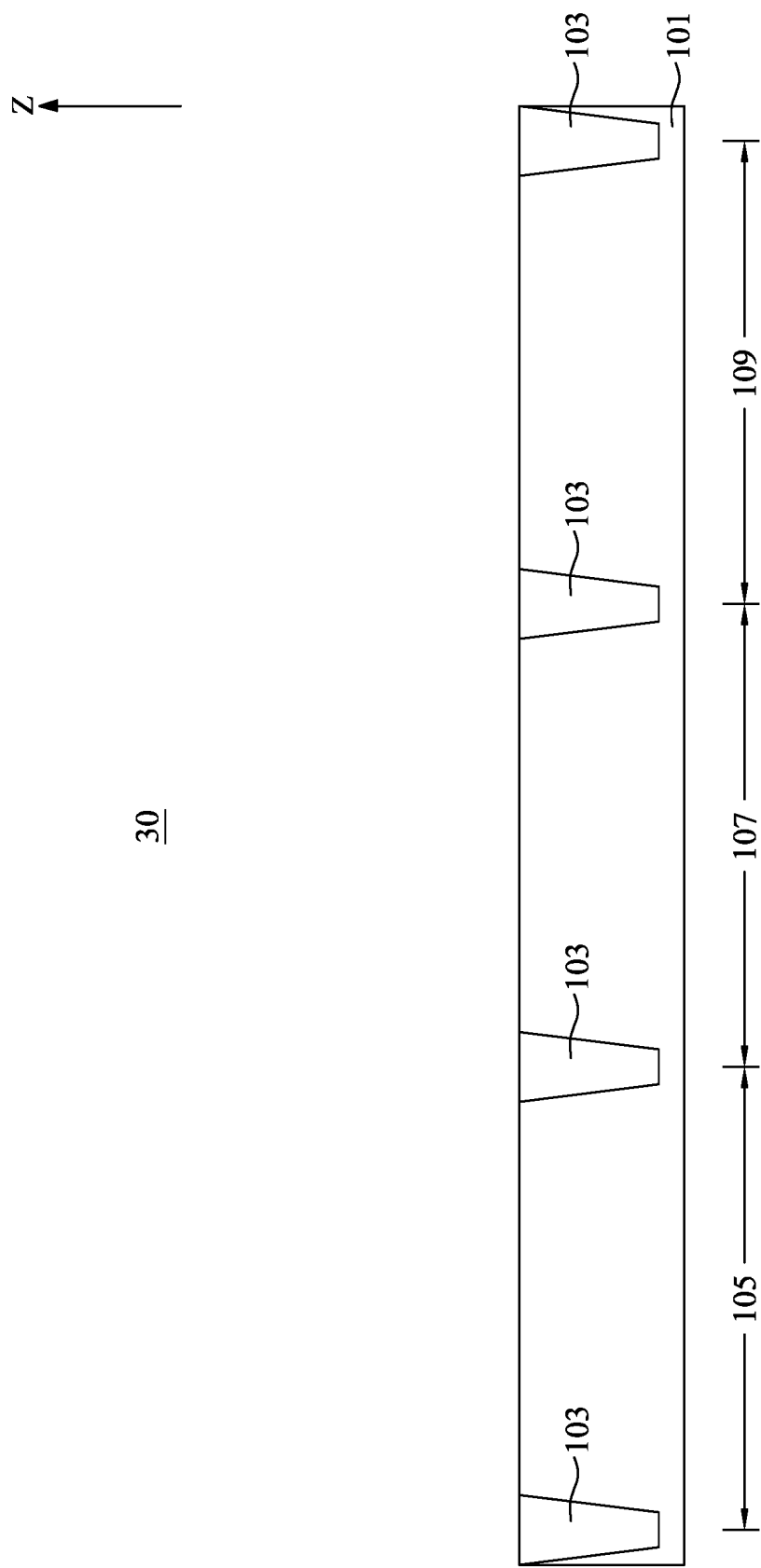

With reference to FIGS. 8 and 10, at step S13, in the embodiment depicted, an isolation layer 103 may be formed in the substrate 101. (Four isolation layers 103 are shown in the cross-sectional diagram in FIG. 10, but other quantities of isolation layers may be used in other embodiments.) The isolation layer 103 may define a first active region 105, a second active region 107, and a third active region 109. A photolithography process may be performed to define a position of the isolation layer 103 in the substrate 101. After the photolithography process, an etch process, such as an anisotropic dry etch process, may be performed to form a plurality of trenches in the substrate 101. An insulating material such as silicon oxide, silicon nitride, silicon oxynitride, silicon nitride oxide, or fluoride-doped silicate may be deposited into the plurality of trenches by a deposition process. After the deposition process, a planarization process, such as chemical mechanical polishing, may be performed to remove excess material, provide a substantially flat surface for subsequent processing steps, and conformally form the isolation layer 103.

Figure 11:
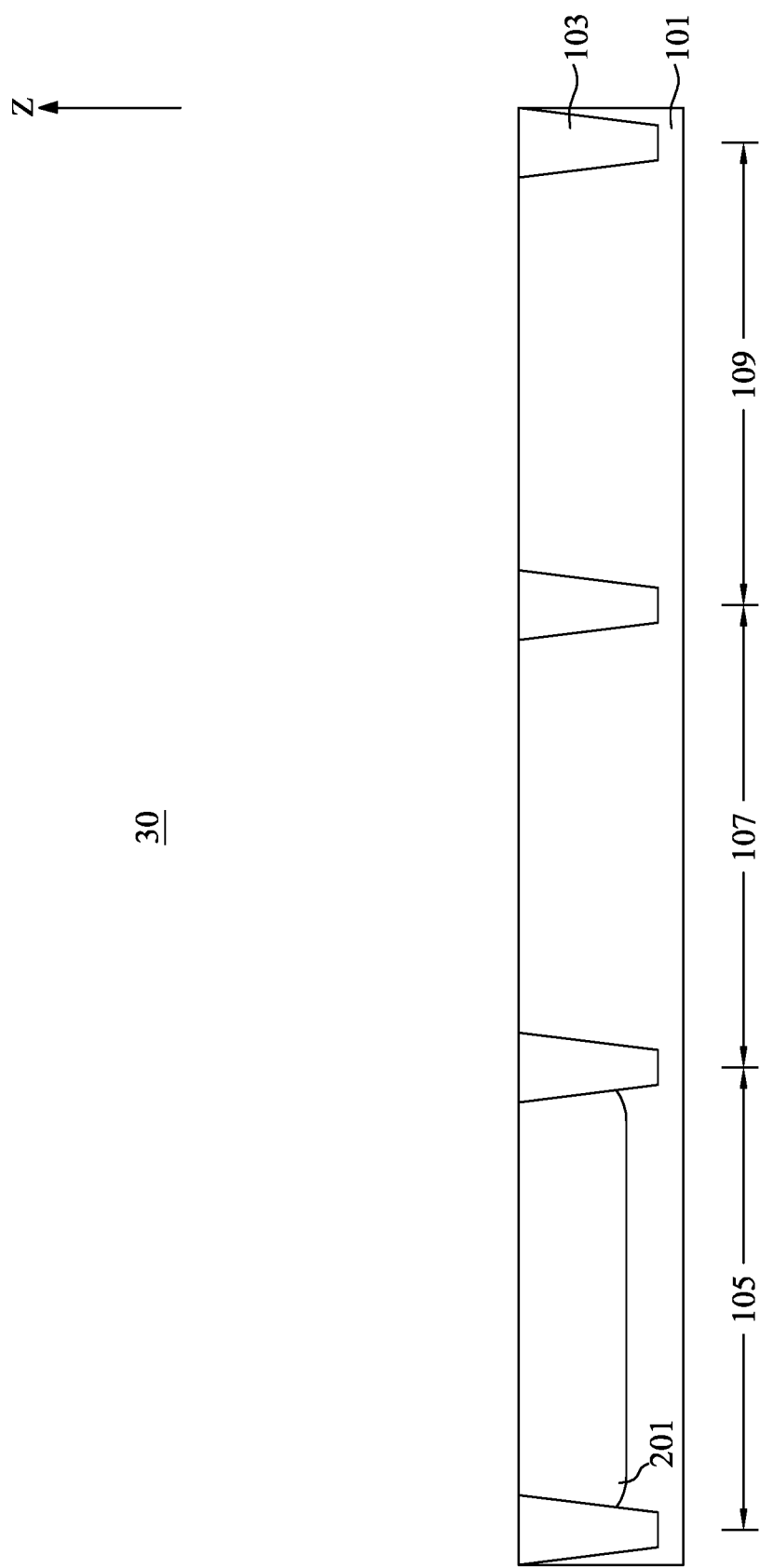
Figure 12:
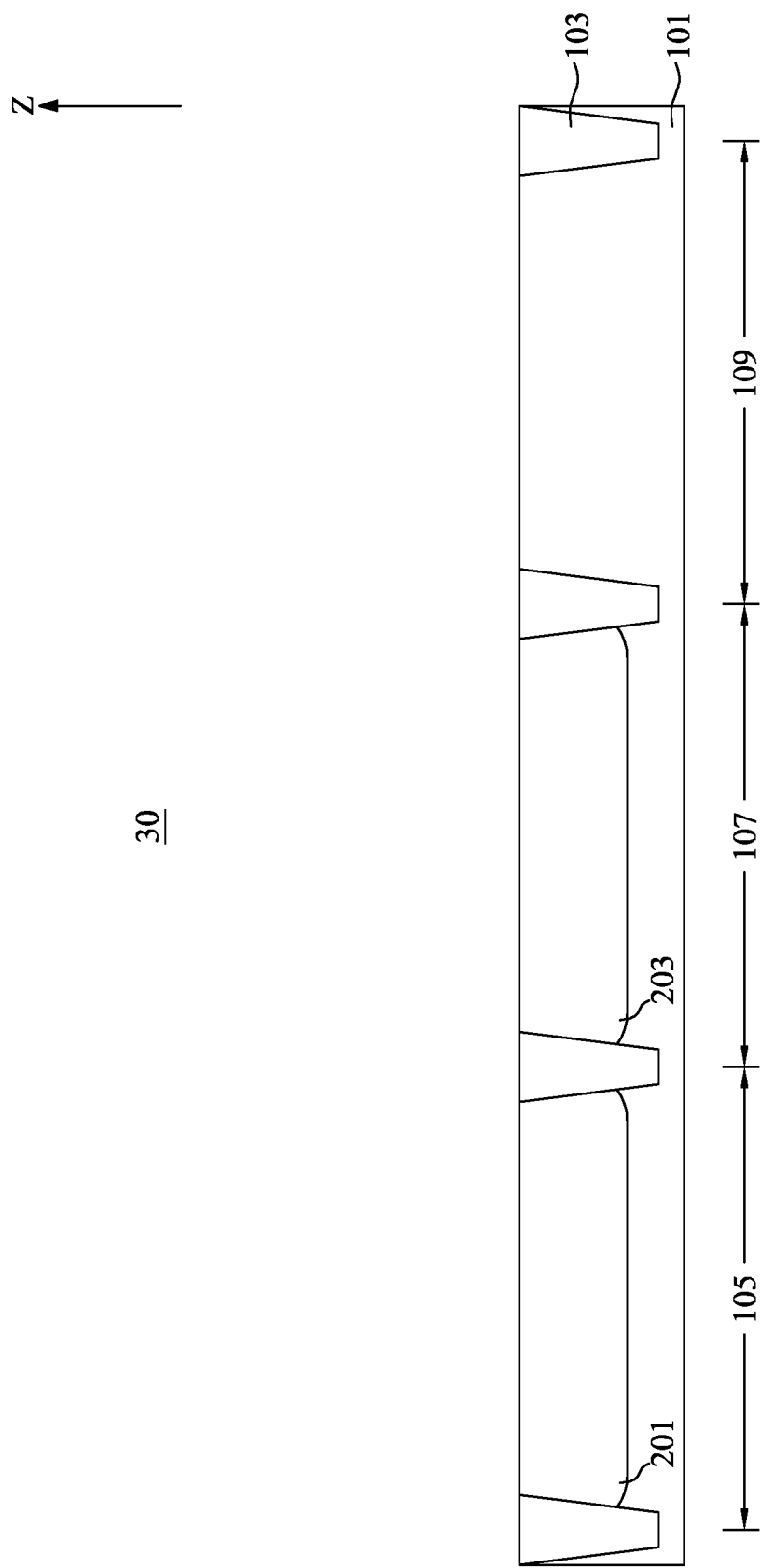

With reference to FIGS. 8, 11 and 12, at step S15, in the embodiment depicted, a plurality of well regions may be formed in the substrate 101. The plurality of well regions may include a first well 201 and a second well 203. With reference to FIG. 11, a first implantation process may be performed using boron as a dopant to form the first well 201 in the first active region 105 of the substrate 101. It should be noted that, during the first implantation process, the second active region 107 and the third active region 109 may be masked. With reference to FIG. 12, a second implantation process may be performed using phosphorus, arsenic, or antimony as a dopant to form the second well 203 in the second active region 107 of the substrate 101. It should be noted that, during the second implantation process, the first active region 105 and the third active region 109 may be masked.

Figure 13:
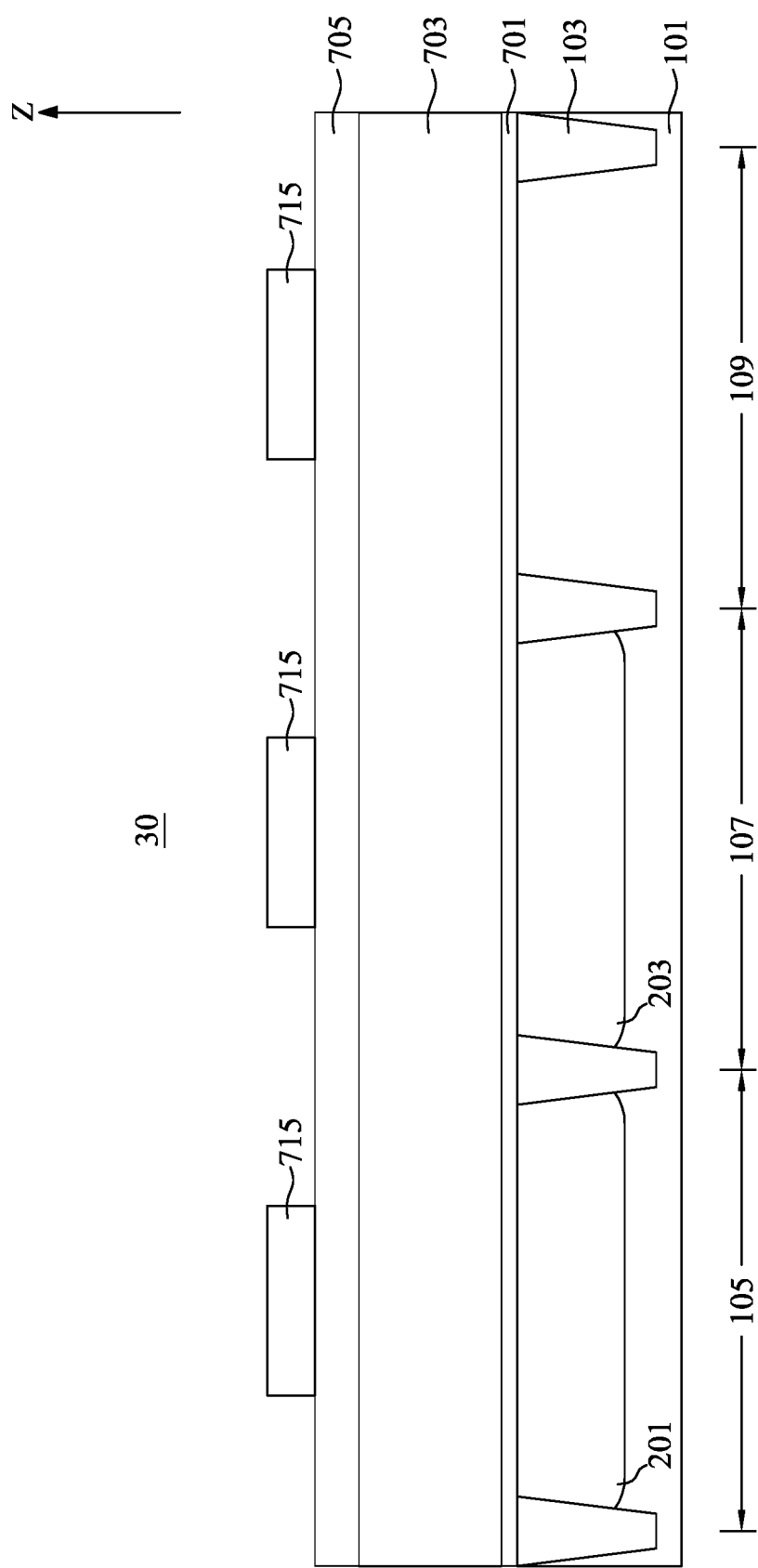
Figure 14:
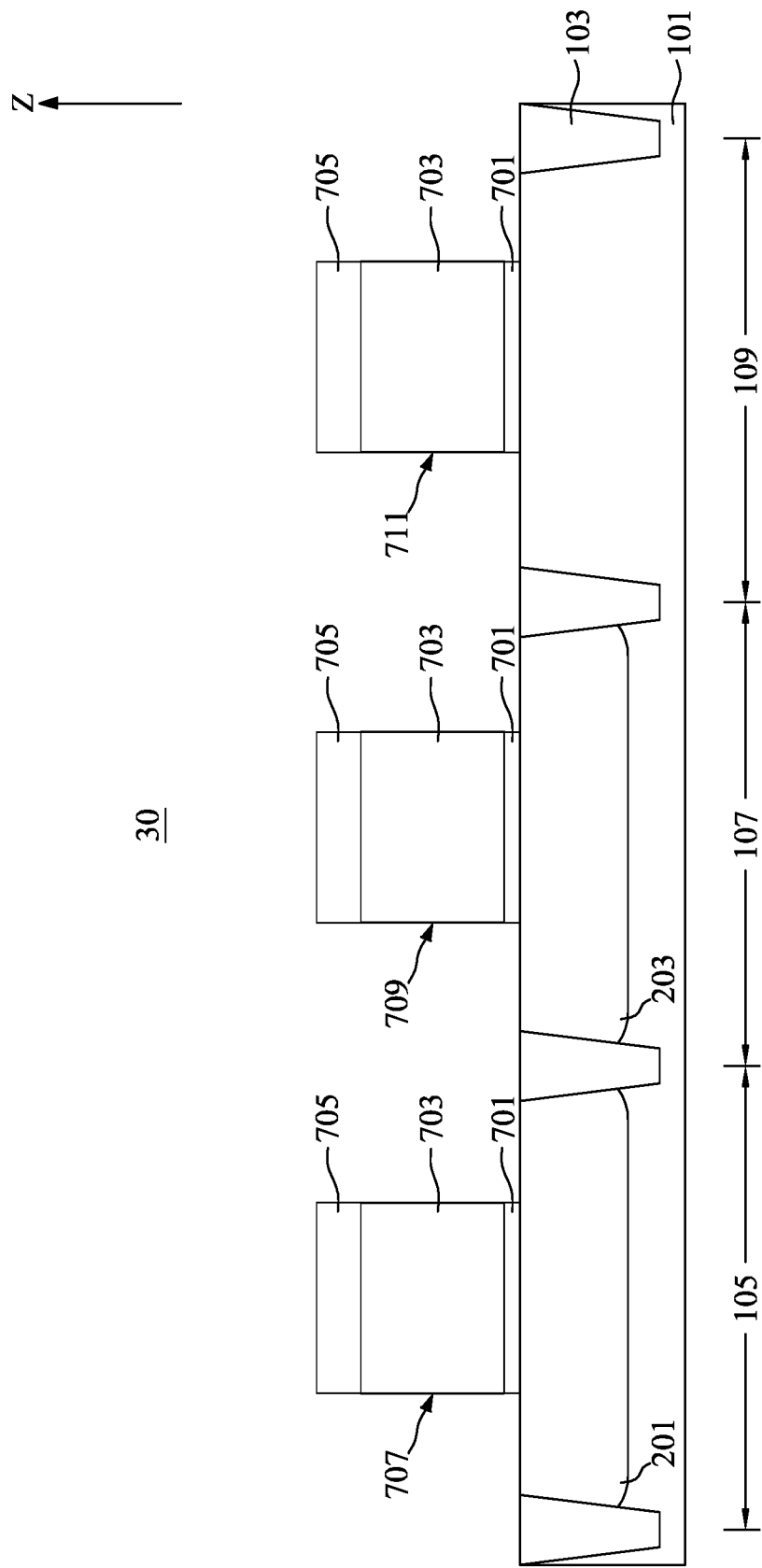

With reference to FIGS. 8, 13 and 14, at step S17, in the embodiment depicted, a plurality of sacrificial structures may be formed above the substrate 101. The plurality of sacrificial structures may include a first sacrificial structure 707, a second sacrificial structure 709, and a third sacrificial structure 711. With reference to FIG. 13, a series of deposition processes may be performed to deposit a sacrificial bottom layer 701, a sacrificial top layer 703, a first mask layer 705, and a second mask layer 715. The sacrificial bottom layer 701 may be disposed on the substrate 101. The sacrificial top layer 703 may be disposed on the sacrificial bottom layer 701. The first mask layer 705 may be disposed on the sacrificial top layer 703. The second mask layer 715 may be disposed on the first mask layer 705. A photolithography process may be performed to define positions of the first sacrificial structure 707, the second sacrificial structure 709, and the third sacrificial structure 711 on the first mask layer 705 by patterning the second mask layer 715. Additionally, an antireflective coating layer may be disposed on the first mask layer 705 to enhance the photolithography process for patterning the second mask layer 715.

The sacrificial bottom layer 701 may be formed of, for example, silicon nitride, silicon oxide, silicon oxynitride, silicon nitride oxide, or the like. The sacrificial top layer 703 may be formed of, for example, poly silicon. The first mask layer 705 may include silicon nitride, silicon oxynitride, silicon carbide, or the like. A thickness of the first mask layer 705 may be between about 100 angstroms and about 400 angstroms. The second mask layer 715 may be a photoresist layer.

With reference to FIG. 14, an etch process, such as an anisotropic dry etch process, may be performed to remove parts of the sacrificial bottom layer 701, the sacrificial top layer 703, and first mask layer 705 and to concurrently form the first sacrificial structure 707, the second sacrificial structure 709, and the third sacrificial structure 711. The first sacrificial structure 707 may be disposed on the first active region 105. The second sacrificial structure 709 may be disposed on the second active region 107. The third sacrificial structure 711 may be disposed on the third active region 109.

With reference to FIGS. 8 and 15 to 21, at step S19, in the embodiment depicted, a plurality of doped subregions and a plurality of stress regions may be formed in the substrate 101 and a plurality of spacers 205 may be formed above the substrate 101. The plurality of doped subregions may include plurality of first doped subregions 207 and a plurality of second doped subregions 209. The plurality of stress regions may include a plurality of first stress regions 211 and plurality of second stress regions 213.

Figure 15:
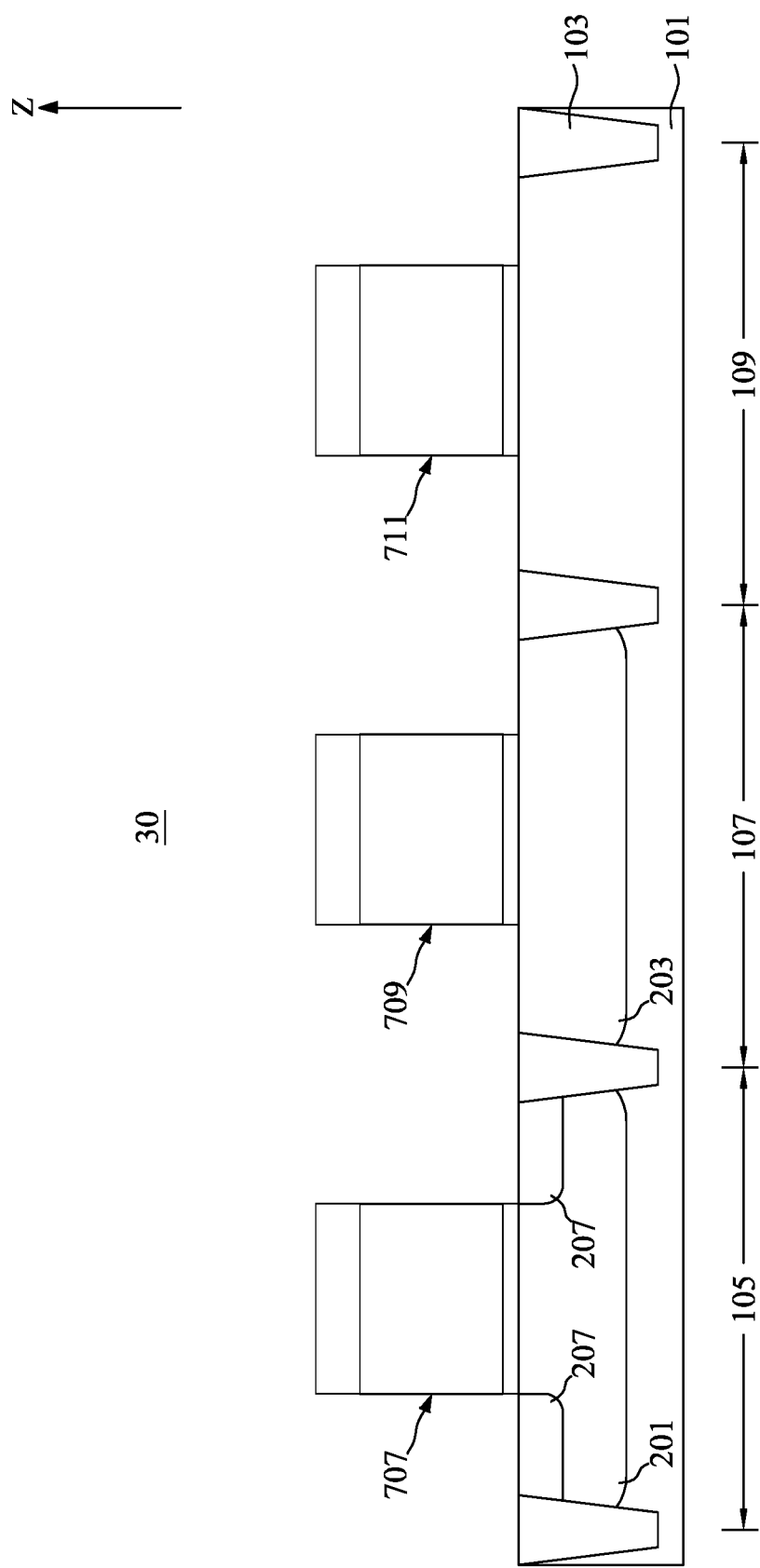
Figure 16:
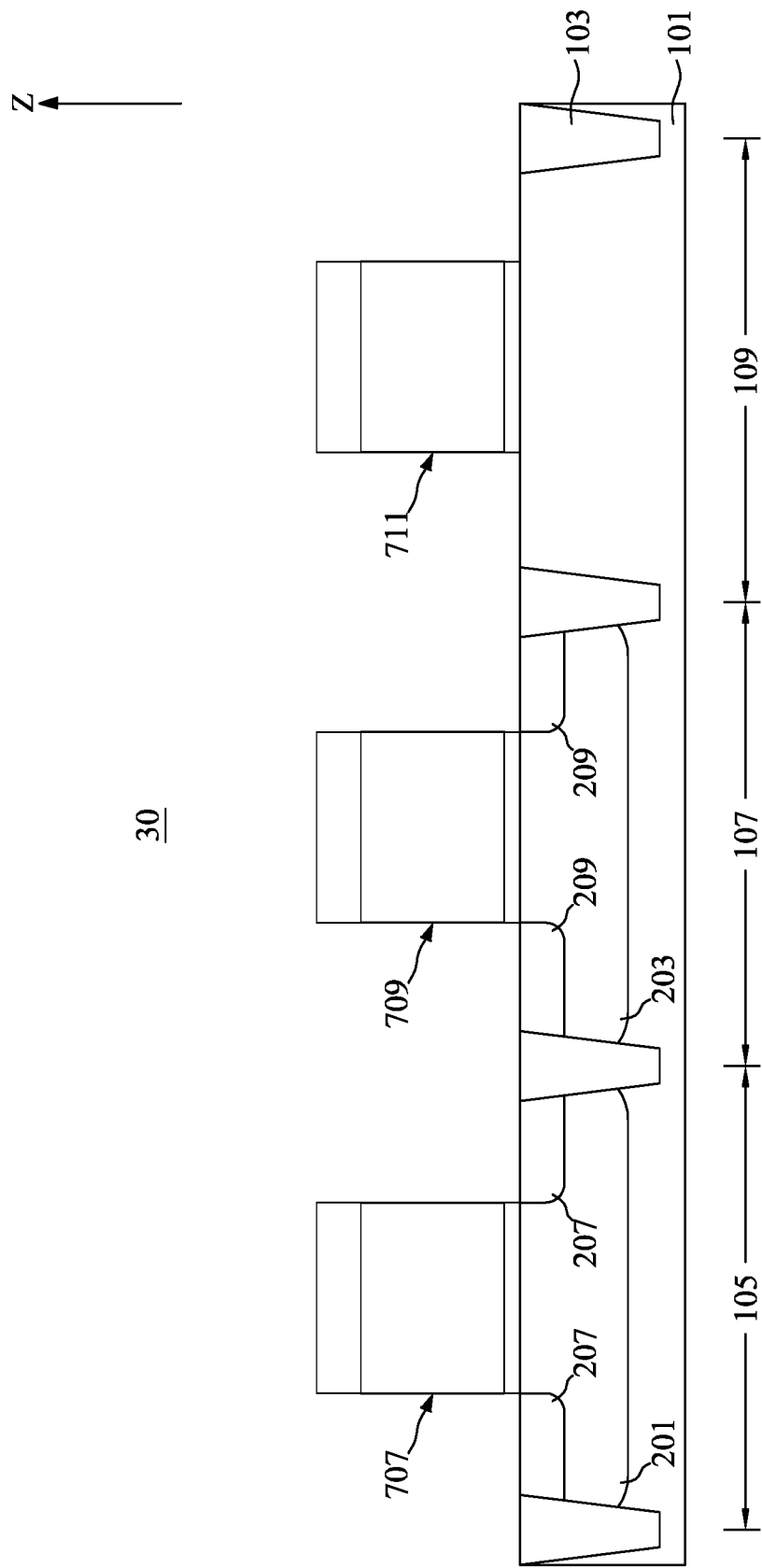

With reference to FIG. 15, a first implantation process may be performed to form the plurality of first doped subregions 207. During the first implantation process, the second active region 107 and the third active region 109 may be masked. The plurality of first doped subregions 207 may be disposed in the substrate 101 and respectively correspondingly adjacent to two sides of the first sacrificial structure 707. With reference to FIG. 16, a second implantation process may be performed to form the plurality of second doped subregions 209.

During the second implantation process, the first active region 105 and the third active region 109 may be masked. The plurality of second doped subregions 209 may be disposed in the substrate 101 and respectively correspondingly adjacent to two sides of the second sacrificial structure 709.

Figure 17:
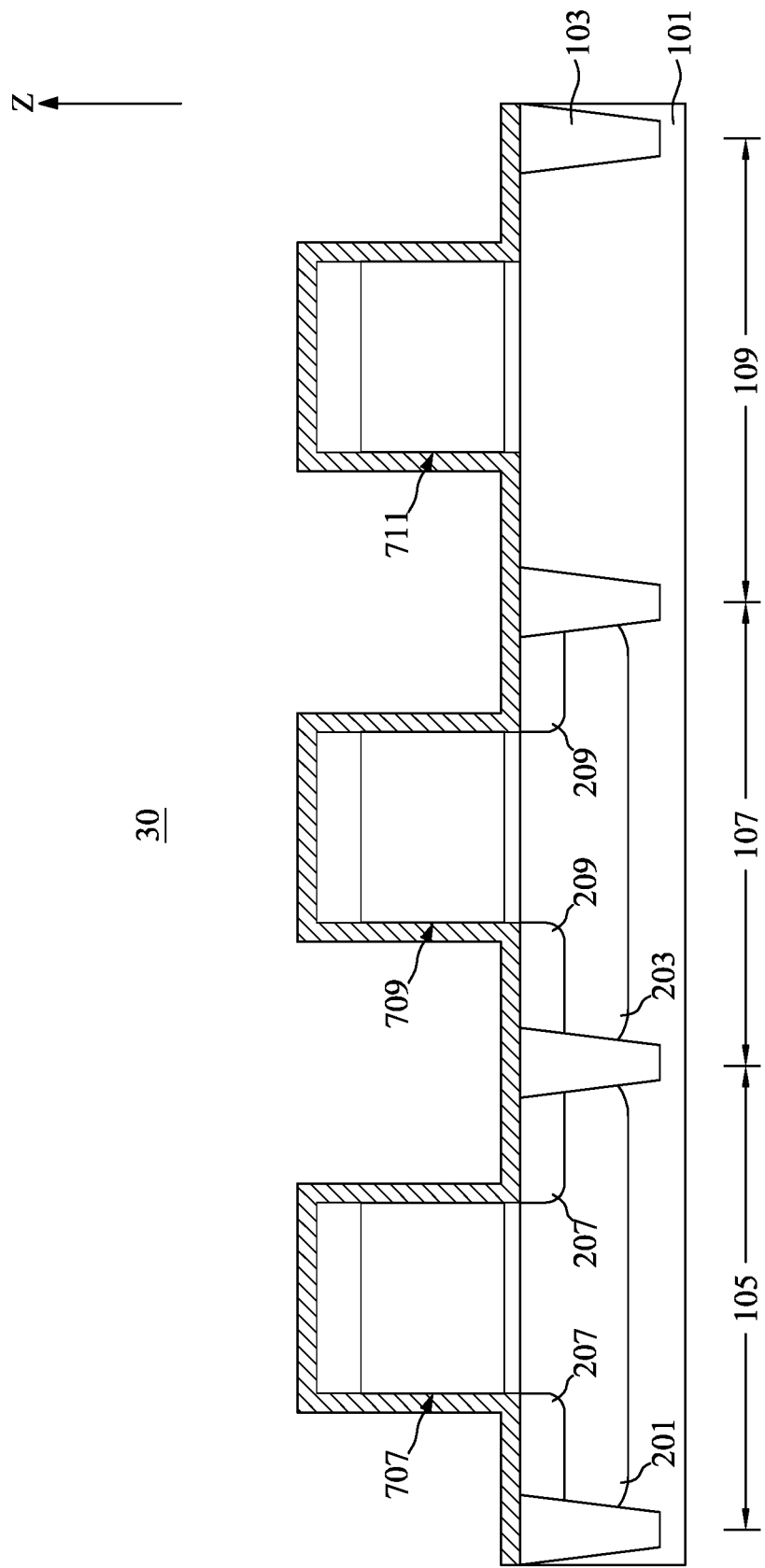
Figure 18:
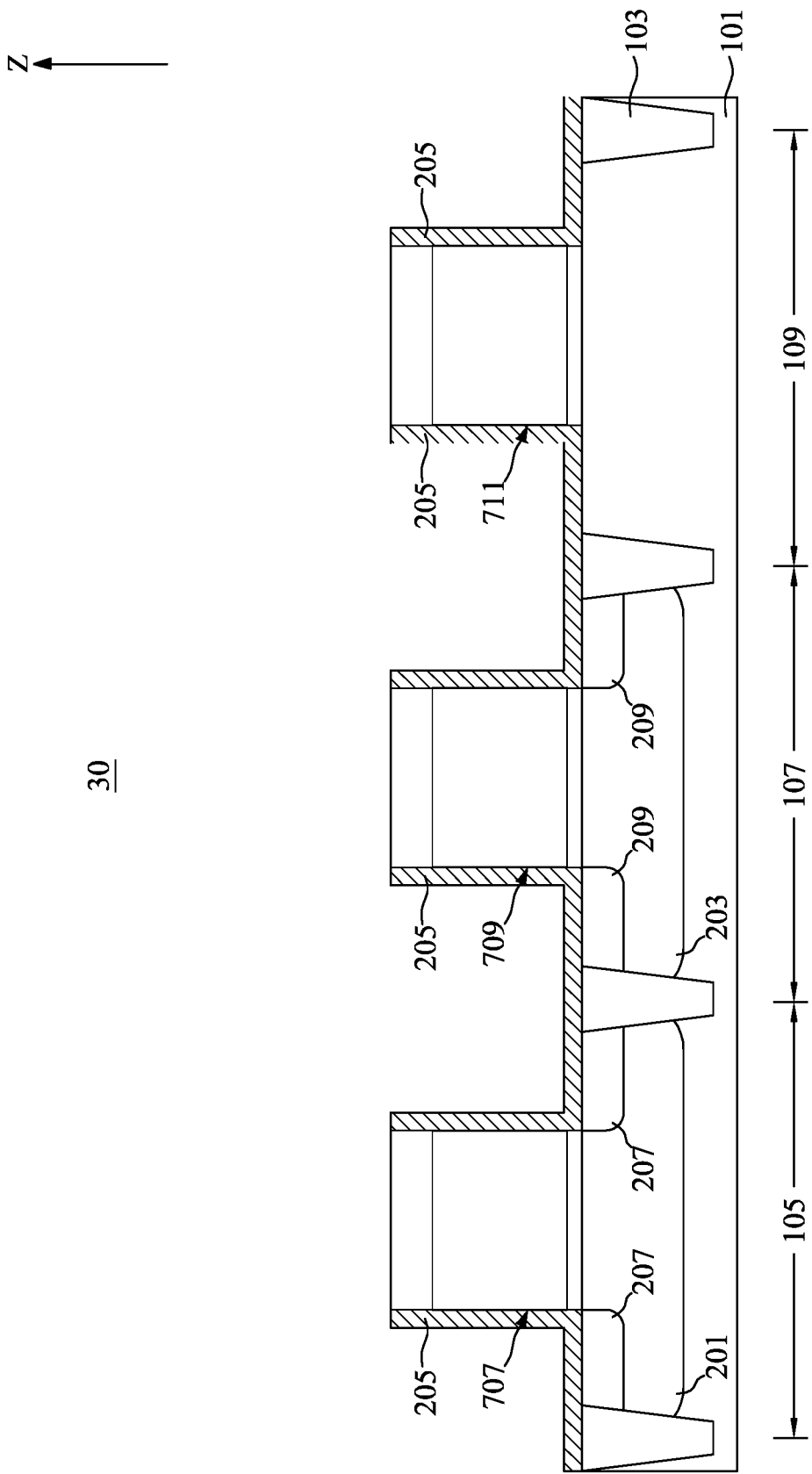

With reference to FIG. 17, a spacer layer 713 may be formed over the substrate 101 and over the first sacrificial structure 707, the second sacrificial structure 709, and the third sacrificial structure 711. The spacer layer 713 may be formed of, for example, silicon oxide, silicon nitride, silicon oxynitride, silicon nitride oxide, or the like. With reference to FIG. 18, an etch process, such as an anisotropic dry etch process, may be performed to form the plurality of spacers 205. The plurality of spacers 205 ma y be respectively correspondingly disposed on and attached to two sidewalls of the first sacrificial structure 707, the second sacrificial structure 709, and the third sacrificial structure 711. A second mask layer 715 may be subsequently formed over the substrate 101 and over the second sacrificial structure 709 and the third sacrificial structure 711. The second mask layer 715 may be a photoresist layer.

Figure 19:
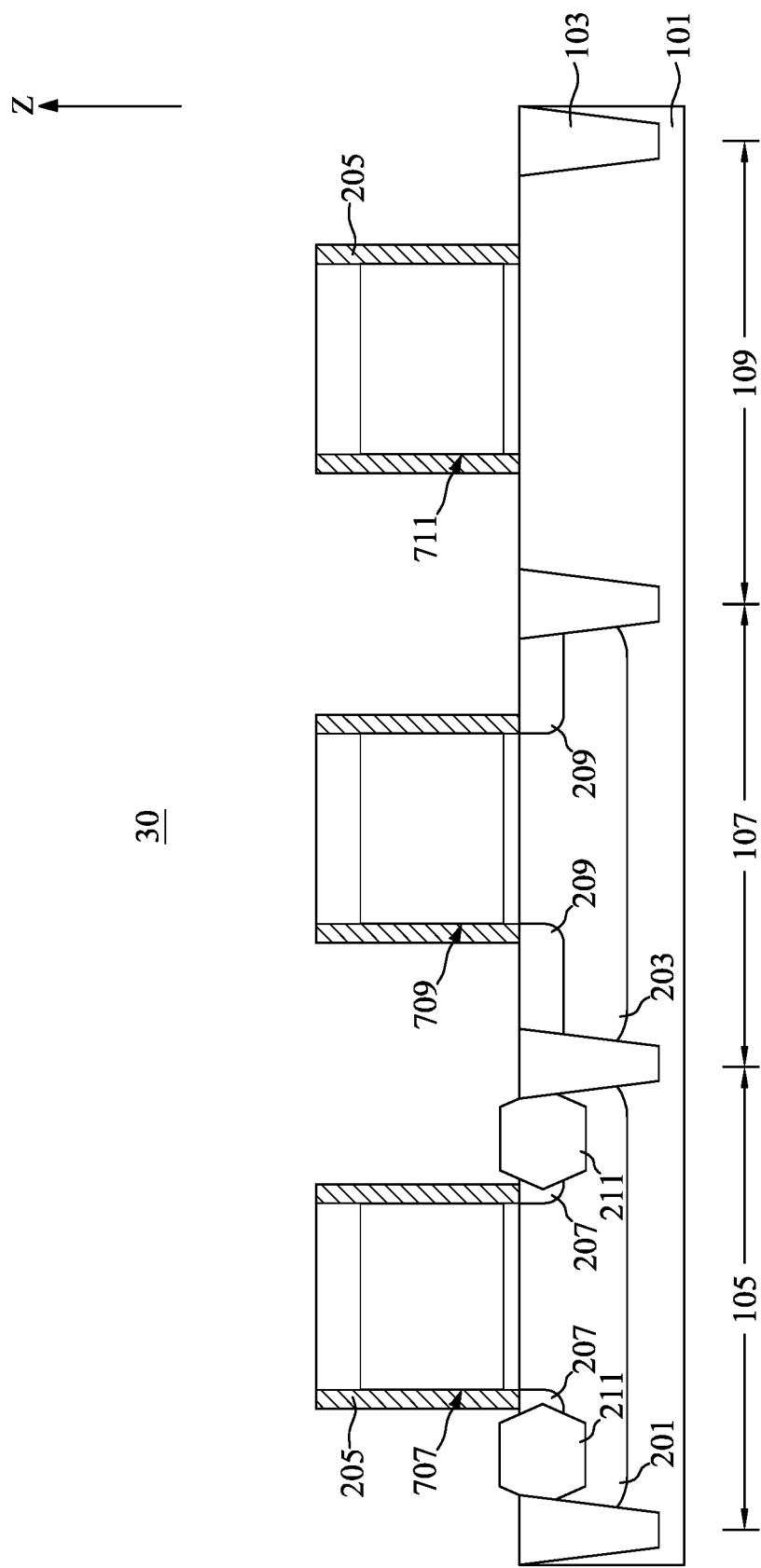
Figure 20:
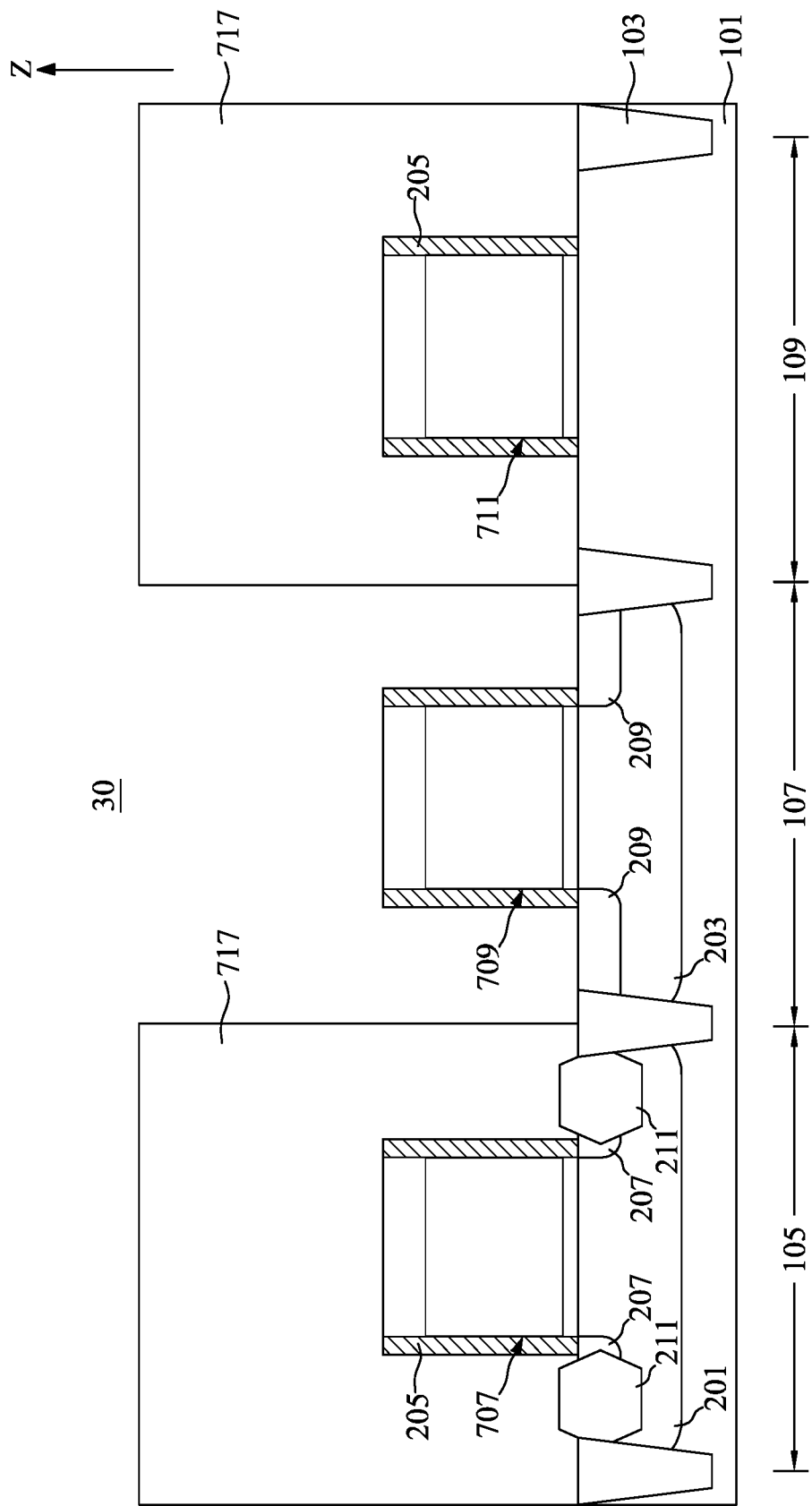
Figure 21:
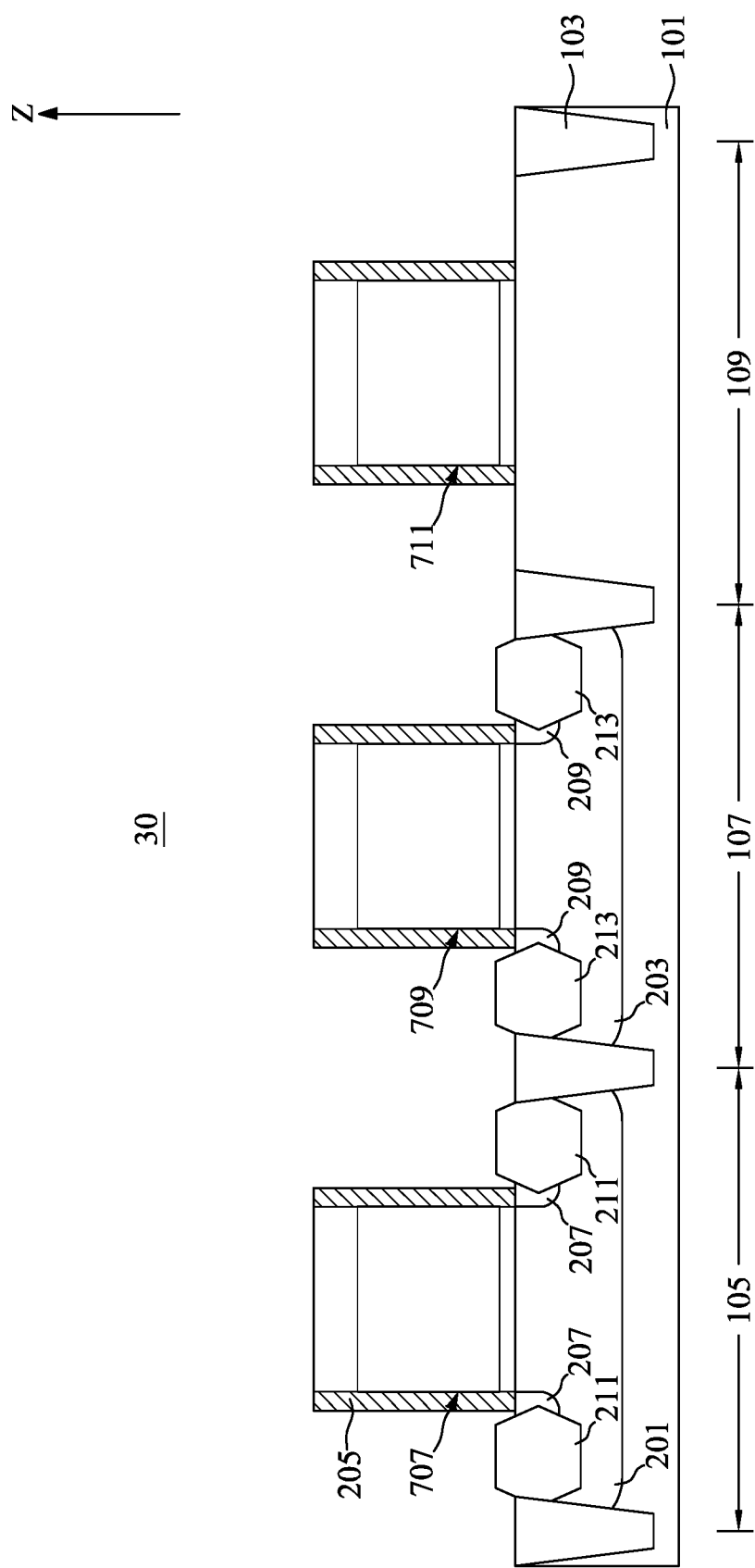

With reference to FIG. 19, a first selective epitaxial growth process may be performed to form the plurality of first stress regions 211 only in the first active region 105. It should be noted that, the second active region 107 and the third active region 109 may be blocked by the second mask layer 715. The plurality of first stress regions 211 may be disposed in the substrate 101 and respectively correspondingly adjacent to the plurality of first doped subregions 207. Upper portions of the plurality of first stress regions 211 may protrude from the top surface o f the substrate 101. The second mask layer 715 may be removed after the first selective epitaxial growth process. With reference to FIG. 20, a third mask layer 717 may be formed over the substrate 101 and over the first sacrificial structure 707 and the second sacrificial structure 709. The third mask layer 717 may be a photoresist layer. With reference to FIG. 21, a second selective epitaxial growth process may be performed to form the plurality of second stress regions 213 only in the second active region 107. It should be noted that, the first active region 105 and the third active region 109 may be blocked by the third mask layer 717. The plurality of second stress regions 213 may be disposed in the substrate 101 and respectively correspondingly adjacent to the plurality of second doped subregions 209. Upper portions of the plurality of second stress regions 213 may protrude from the top surface of the substrate 101. The third mask layer 717 may be removed after the second selective epitaxial growth process.

Figure 22:
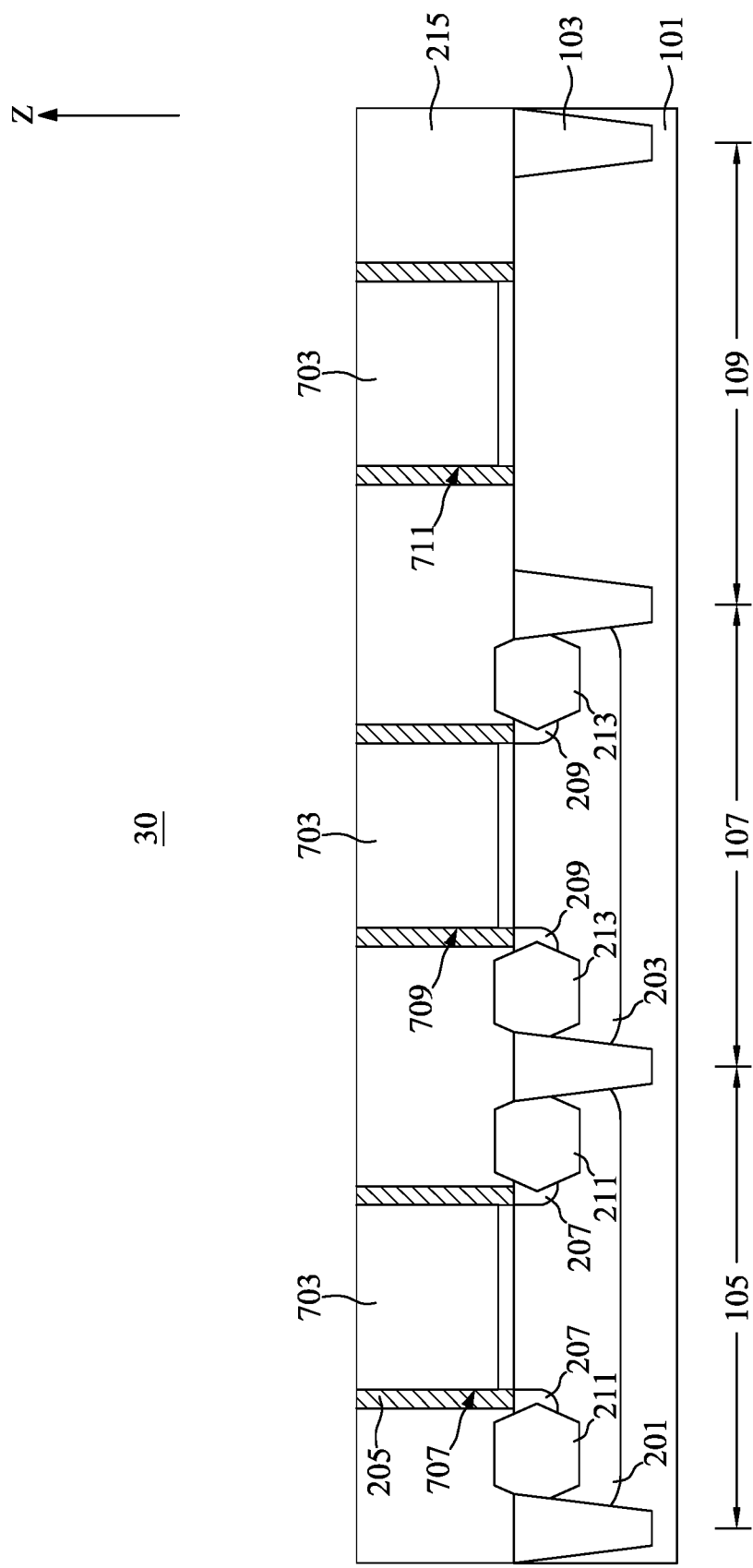
Figure 23:
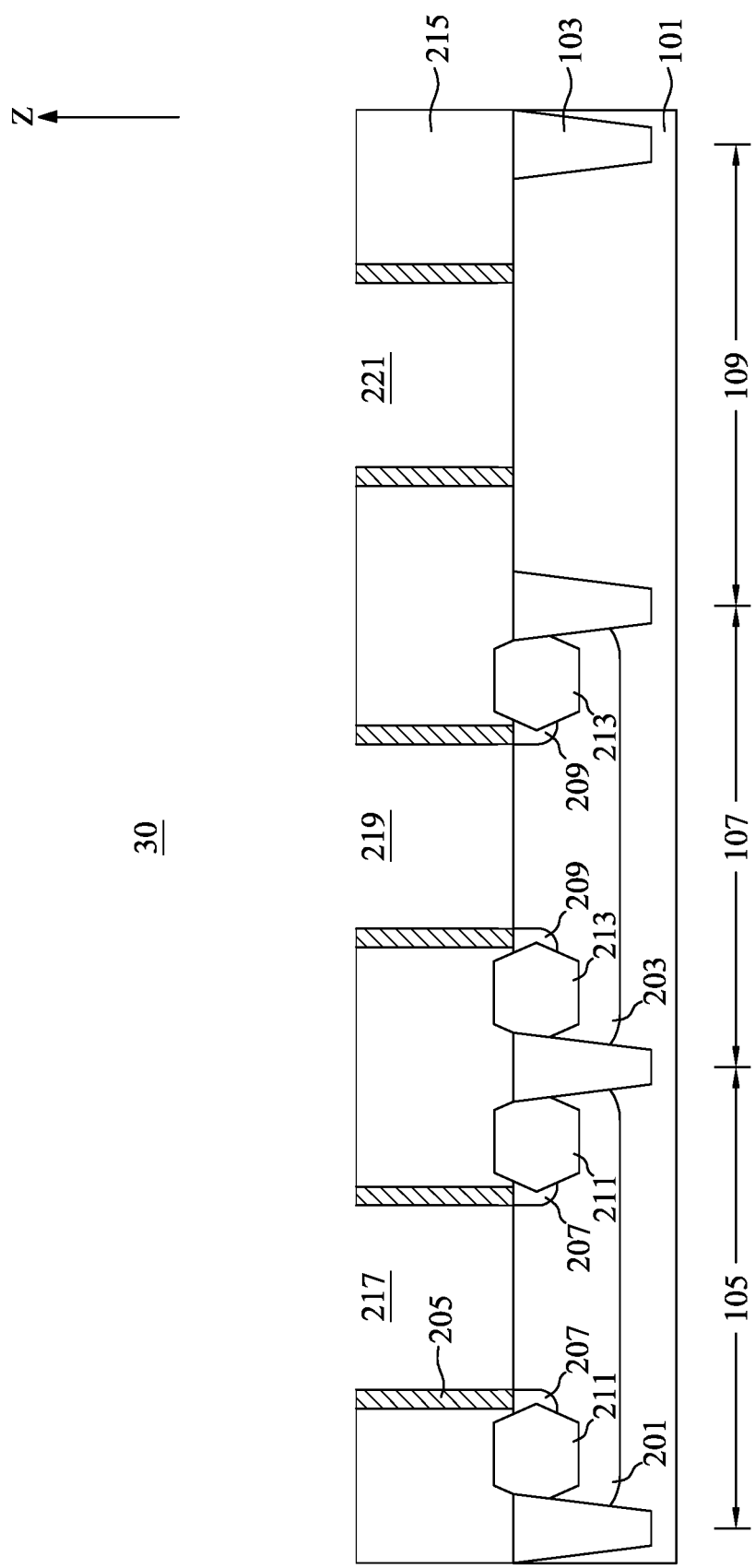

With reference to FIGS. 8, 22 and 23, at step S21, in the embodiment depicted, a plurality of recesses may be formed above the substrate 101. With reference to FIG. 22, a first insulating film 215 may be formed over the substrate 101 and over the first sacrificial structure 707, the second sacrificial structure 709, and the third sacrificial structure 711. The first insulating film 215 may be an oxide layer formed by a high aspect ratio process or a high-density plasma deposition process. A planarization process, such as chemical mechanical polishing, may be performed until the sacrificial top layers 703 of the first sacrificial structure 707, the second sacrificial structure 709, and the third sacrificial structure 711 are exposed.

With reference to FIG. 23, an etch process may be performed to remove the first sacrificial structure 707, the second sacrificial structure 709, and the third sacrificial structure 711. The etch process may be a single-step etching process or a multiple-step etching process. For example, a first wet etch process may be used to remove the sacrificial top layer 703. The first wet etch process may include exposure to a hydroxide-containing solution (e.g., ammonium hydroxide), deionized water, and/or other suitable etchant solutions. A second wet etch process may be used to remove the sacrificial bottom layer 701. The second wet etch process may include exposure to a buffered hydrogen fluoride solution or a buffered oxide etchant. The second wet etch process may selectively remove the sacrificial bottom layer 701 and may stop at the top surface of the substrate 101, thereby forming the plurality of recesses in the places previously occupied by the first sacrificial structure 707, the second sacrificial structure 709, and the third sacrificial structure 711. The plurality of recesses may include a first recess 217, a second recess 219, and a third recess 221. The first recess 217 may be disposed at the place previously occupied by the first sacrificial structure 707. The second recess 219 may be disposed at the place previously occupied by the second sacrificial structure 709. The third recess 221 may be disposed at the place previously occupied by the third sacrificial structure 711.

Figure 24:
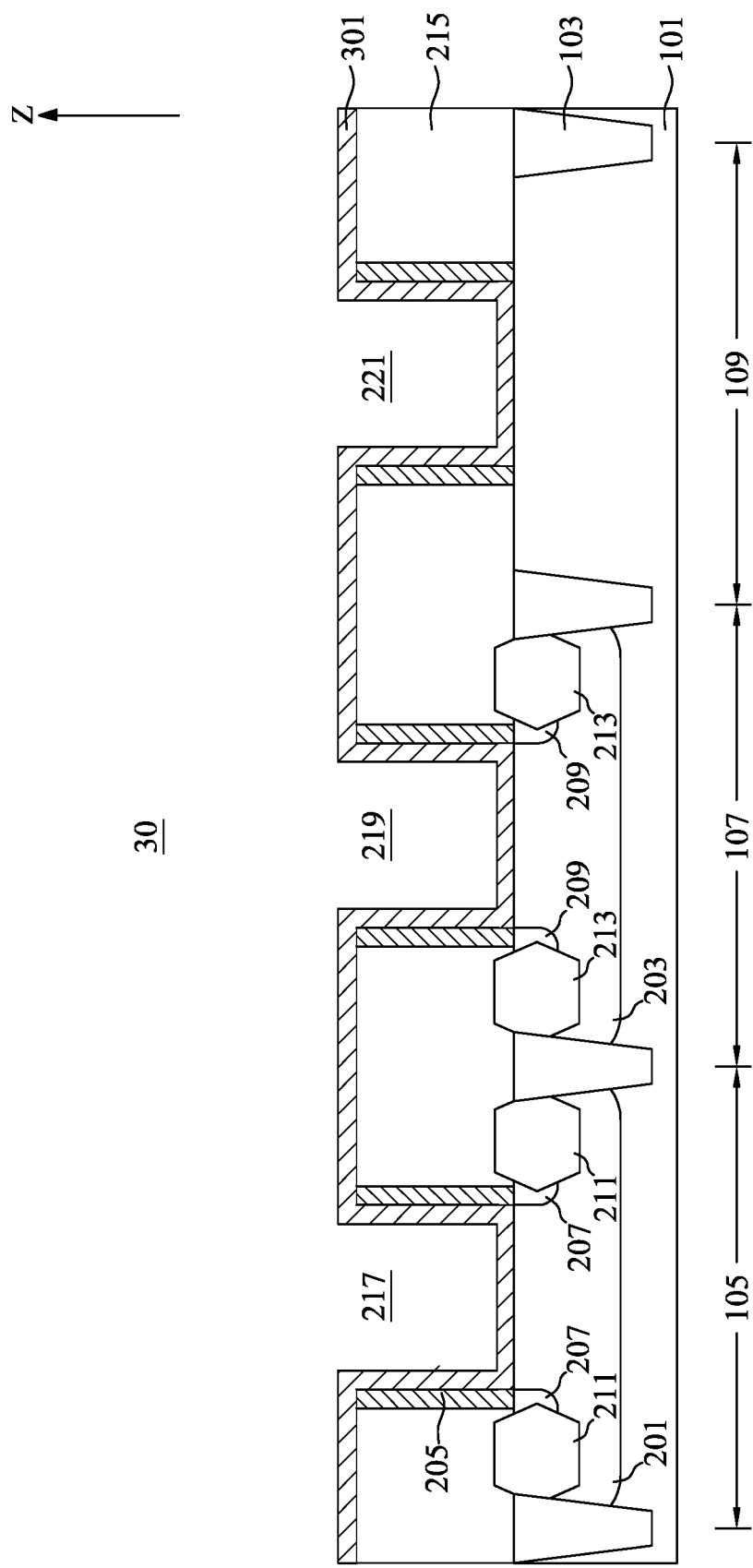

With reference to FIGS. 8 and 24 to 33, at step S23, in the embodiment depicted, a first gate structure 401, a second gate structure 501, and a capacitor structure 601 may be respectively correspondingly formed in the plurality of recesses. With reference to FIG. 24, a first insulating layer 301 may be formed to cover top surfaces of the first insulating film 215, sidewalls of the first recess 217, a bottom of the first recess 217, sidewalls of the second recess 219, a bottom of the second recess 219, sidewalls of the third recess 221, and a bottom of the third recess 221. The first insulating layer 301 may be formed of an insulating material having a dielectric constant of about 4.0 or greater. A thickness of the first insulating layer 301 may be between about 0.5 nm and about 5.0 nm. Preferably, the thickness of the first insulating layer 301 may be between about 0.5 nm and about 2.5 nm. Alternatively, in another embodiment, the insulating material may be silicon oxide, silicon nitride, silicon oxynitride, silicon nitride oxide, or the like.

Figure 25:
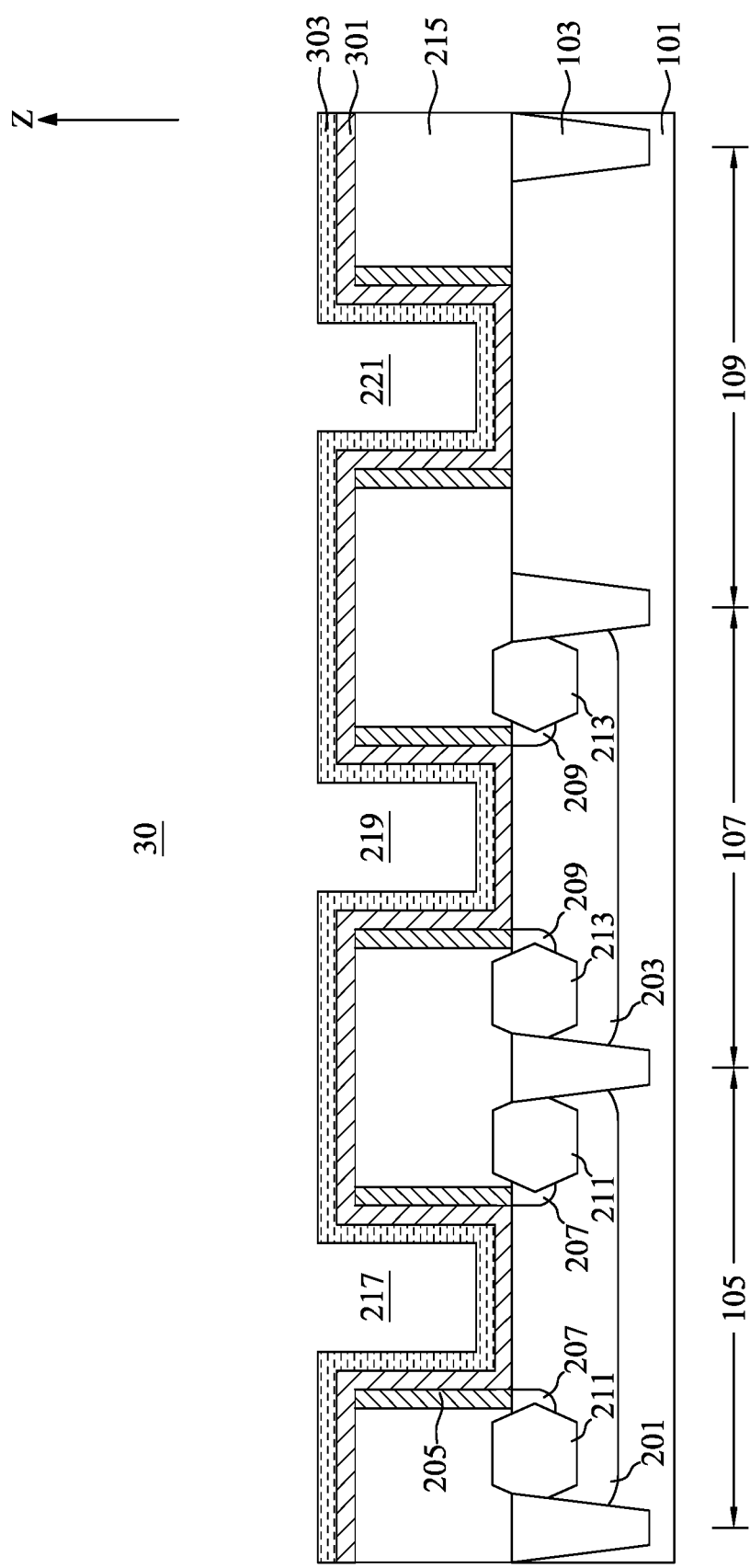
Figure 26:
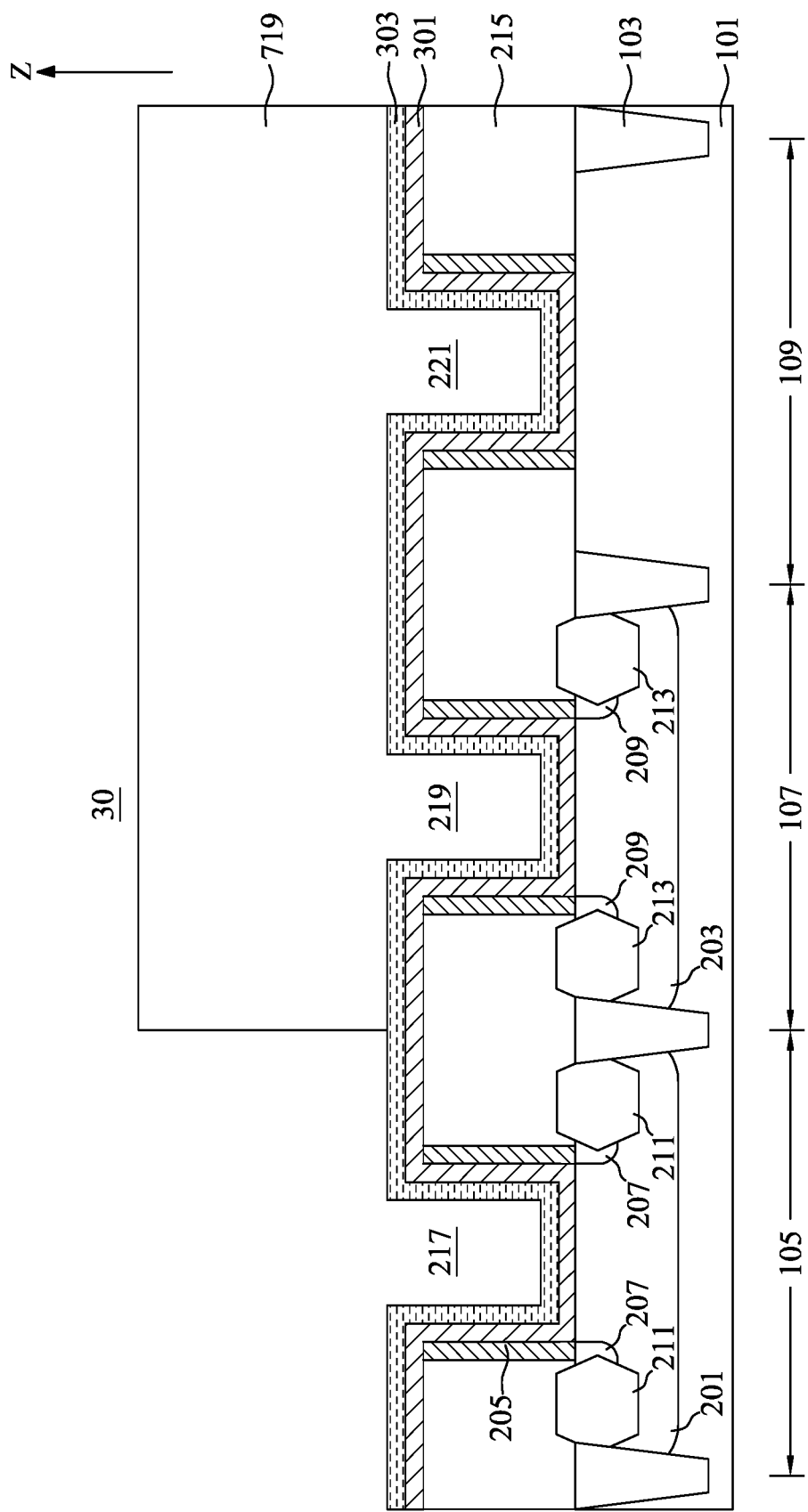
Figure 27:
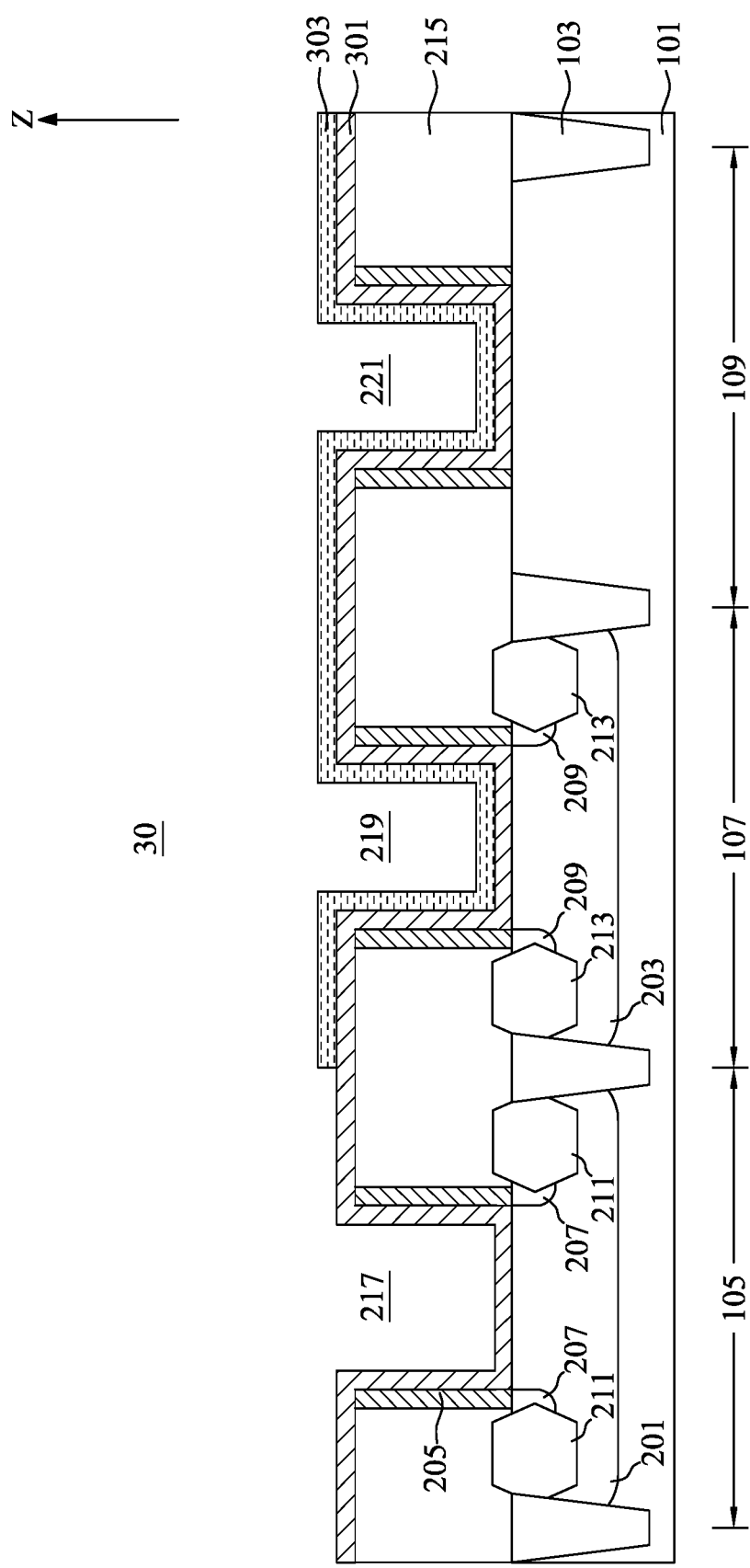

With reference to FIG. 25, a first conductive layer 303 may be formed on the first insulating layer 301 and in the first recess 217, the second recess 219, and the third recess 221. The first conductive layer 303 may be formed of a material including titanium nitride, tantalum nitride, tantalum carbide, tungsten nitride, or ruthenium. A thickness of the first conductive layer 303 may be between about 10 angstroms and about 100 angstroms. With reference to FIG. 26, a fourth mask layer 719 may be formed to cover regions above the second active region 107 and the third active region 109. The fourth mask layer 719 may be a photoresist layer. With reference to FIG. 27, an etch process may be performed to remove a portion of the first conductive layer 303 disposed above the first active region 105. As a result, a portion of the first insulating layer 301 disposed above the first active region 105 may be exposed. After the etch process, the fourth mask layer 719 may be removed.

Figure 28:
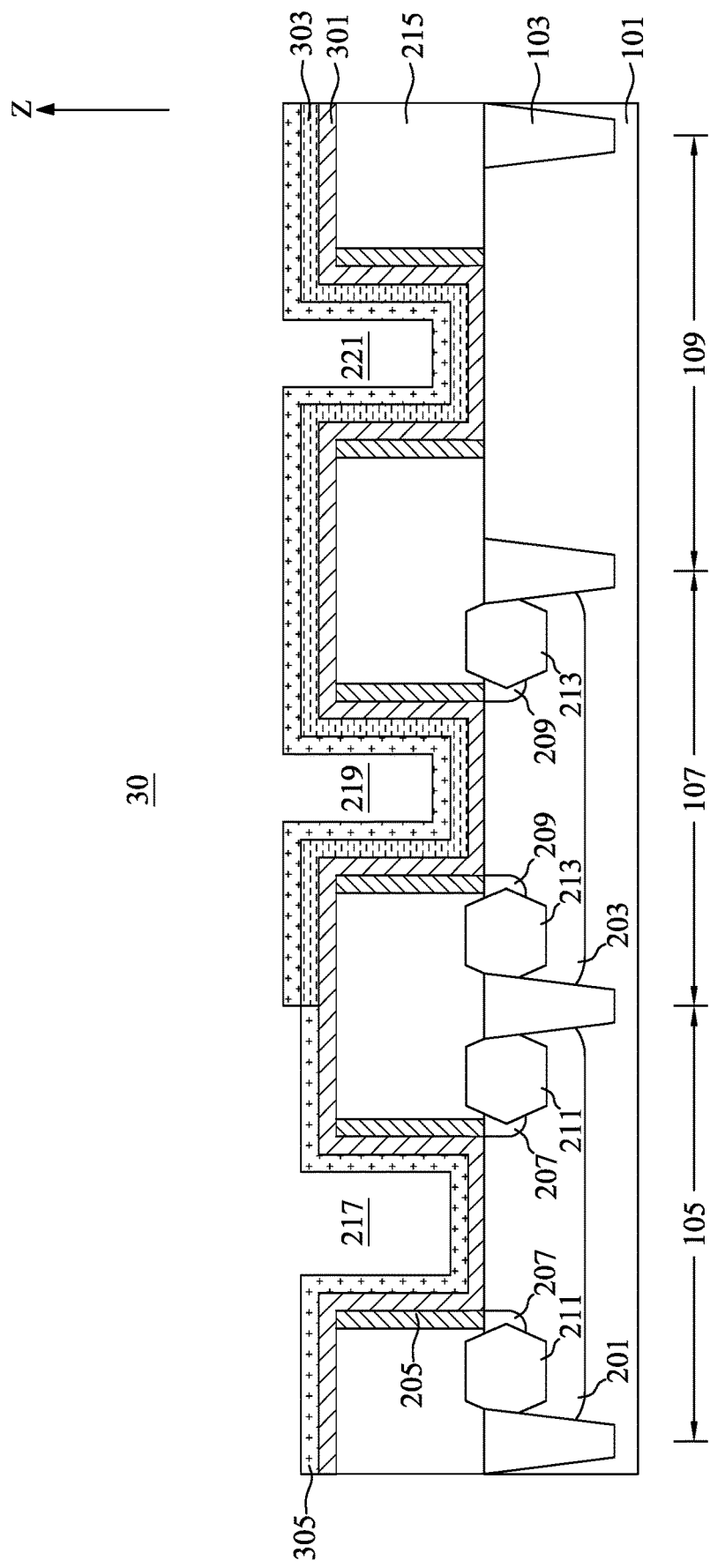
Figure 29:
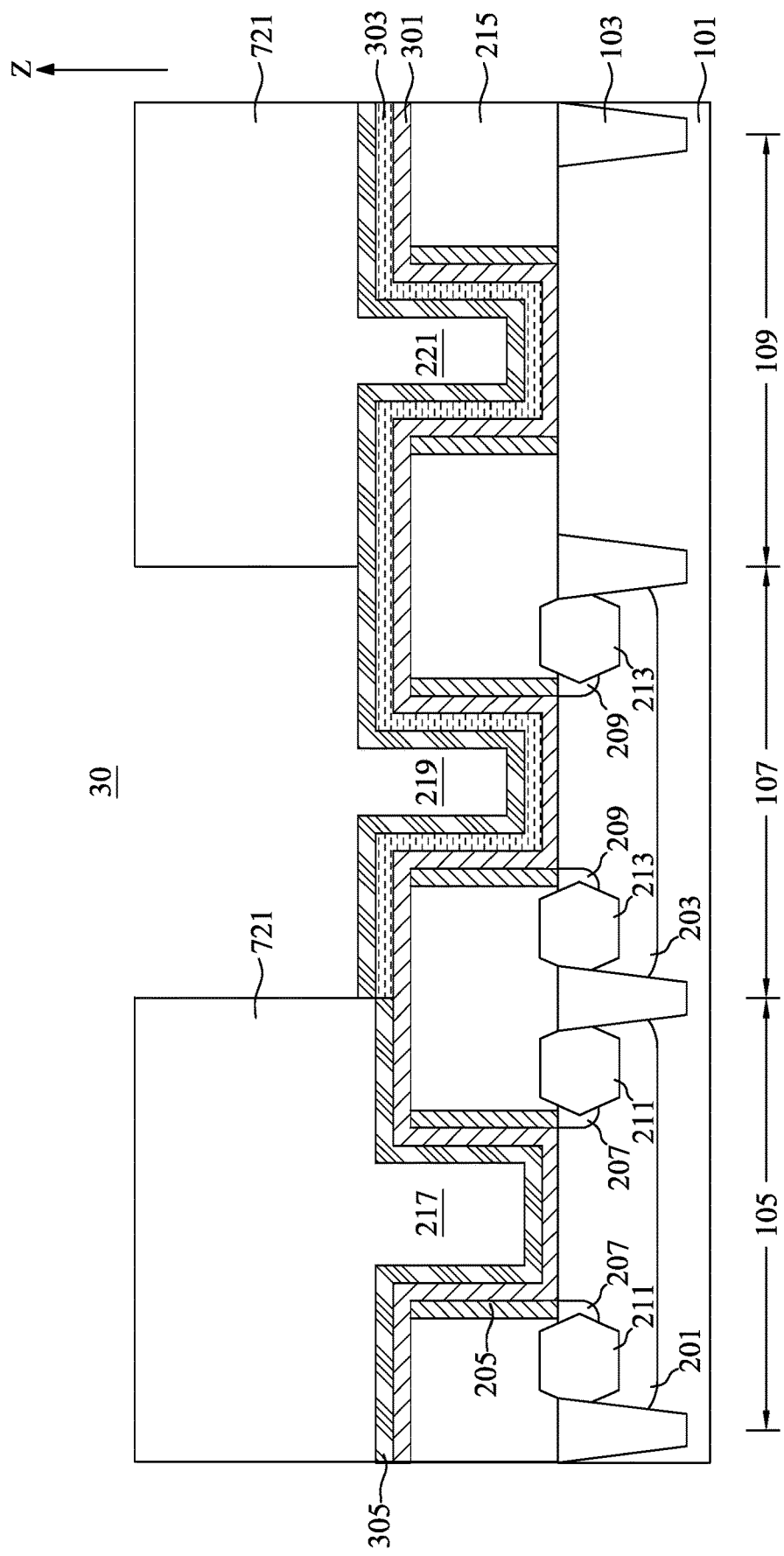
Figure 30:
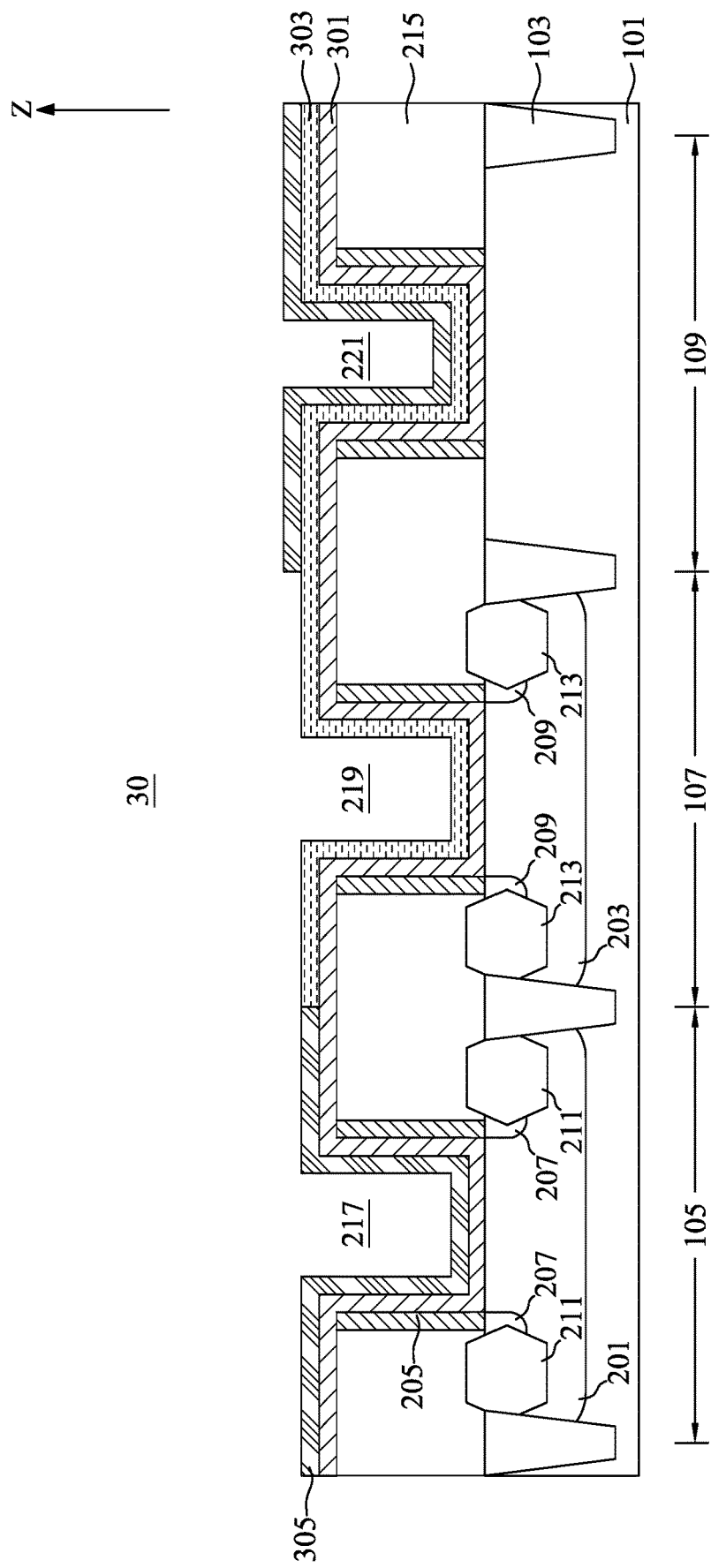

With reference to FIG. 28, a second insulating layer 305 may be formed on the first conductive layer 303 and the portion of the first insulating layer 301 disposed above the first active region 105. The second insulating layer 305 may be formed of, for example, silicon oxide, silicon nitride, silicon oxynitride, silicon nitride oxide, or the like. With reference to FIG. 29, a fifth mask layer 721 may be formed to cover regions above the first active region 105 and the third active region 109. The fifth mask layer 721 may be a photoresist layer. With reference to FIG. 30, an etch process may be performed to remove the second insulating layer 305 disposed above the second active region 107. As a result, the portion of the first conductive layer 303 disposed above the second active region 107 may be exposed. After the etch process, the fifth mask layer 721 may be removed.

Figure 31:
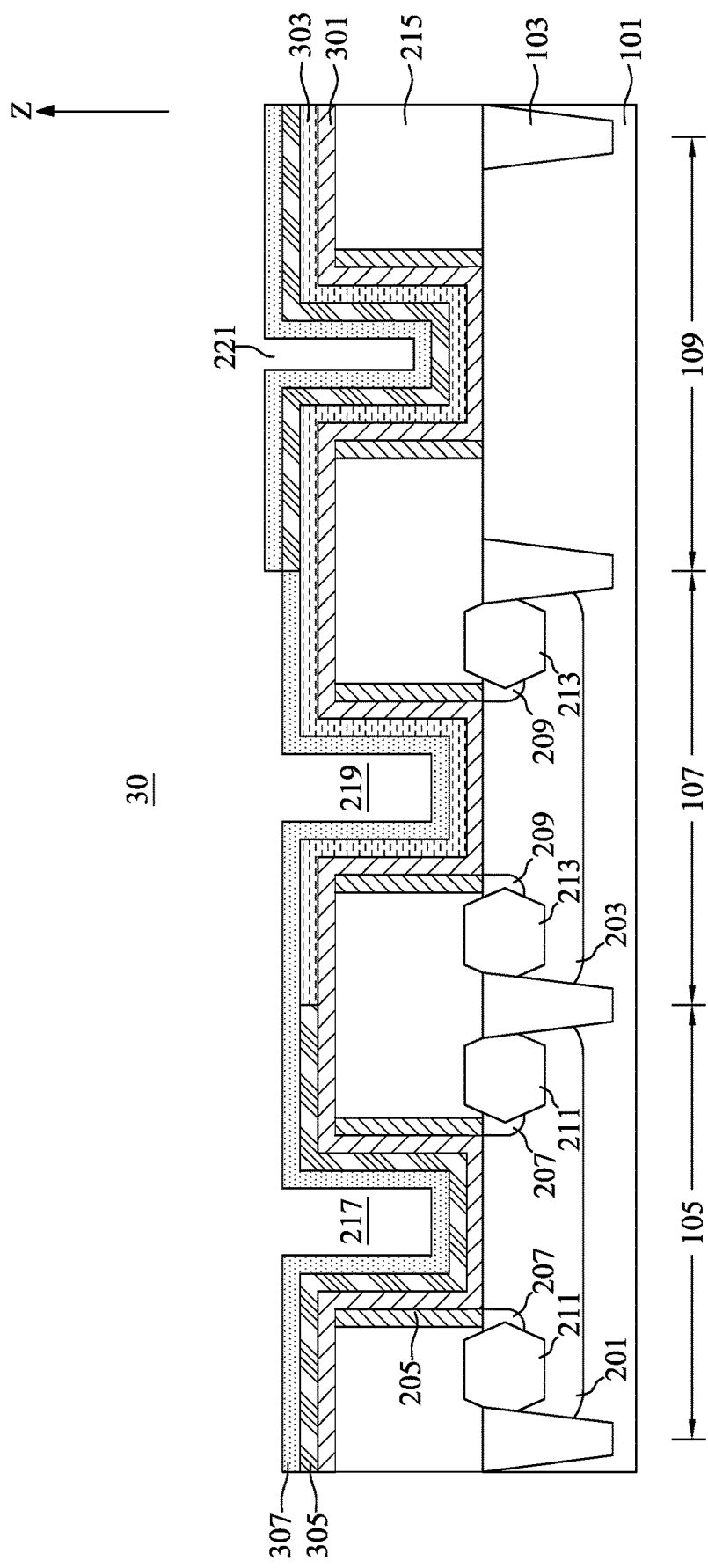

With reference to FIG. 31, a second conductive layer 307 may be formed on the second insulating layer 305 and the portion of the first conductive layer 303 disposed above the second active region 107. The second conductive layer 307 may be formed of a material including titanium, titanium nitride, aluminum, titanium aluminum, titanium aluminum nitride, tantalum nitride, tantalum carbide, tantalum carbonitride, tantalum silicon nitride, zirconium, or manganese. A thickness of the second conductive layer 307 may be between about 10 angstroms and about 200 angstroms. Preferably, the thickness of the second conductive layer 307 may be between about 10 angstroms and about 100 angstroms.

Figure 32:
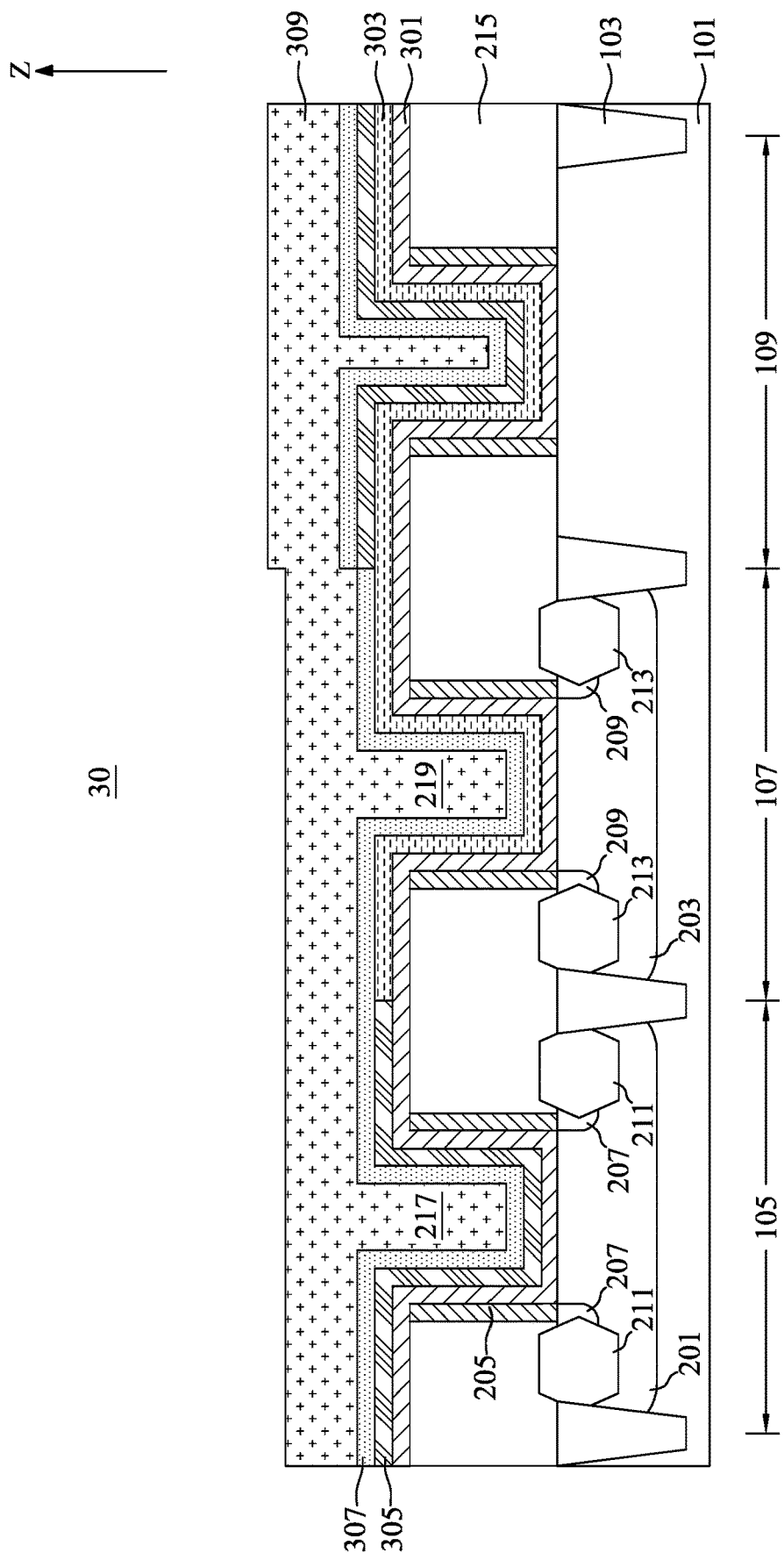
Figure 33:
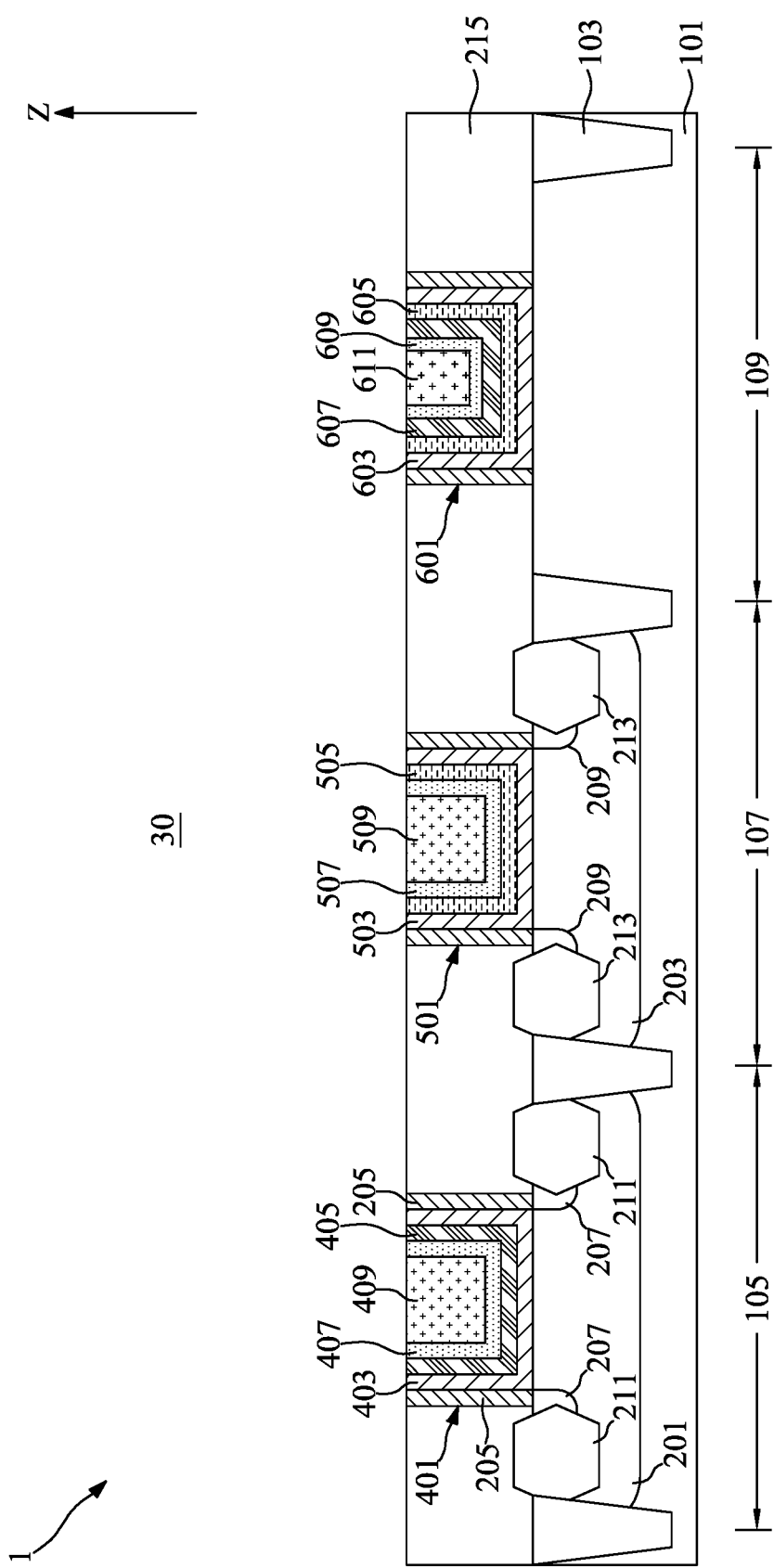

With reference to FIG. 32, a filler layer 309 may be formed on the second conductive layer 307 and may fill the first recess 217, the second recess 219, and the third recess 221. The filler layer 309 may be formed of, for example, tungsten or aluminum. With reference to FIG. 33, a planarization process, such as chemical mechanical polishing, may be performed until the top surfaces of the first insulating film 215 are exposed. The first gate structure 401, the second gate structure 501 and the capacitor structure 601 may be concurrently formed after the planarization process.

With reference to FIG. 33, the first gate structure 401 may include a first gate bottom insulating layer 403, a first gate top insulating layer 405, a first gate top conductive layer 407, and a first gate filler layer 409. The first gate bottom insulating layer 403 may be inwardly disposed in the first insulating film 215 and above the first active region 105. The first gate top insulating layer 405 may be disposed on the first gate bottom insulating layer 403. The first gate top conductive layer 407 may be disposed on the first gate top insulating layer 405. The first gate filler layer 409 may be disposed on the first gate top conductive layer 407.

With reference to FIG. 33, the second gate structure 501 may include a second gate bottom insulating layer 503, a second gate bottom conductive layer 505, a second gate top conductive layer 507, and a second gate filler layer 509. The second gate bottom insulating layer 503 may be inwardly disposed in the first insulating film 215 and above the second active region 107. The second gate bottom conductive layer 505 may be disposed on the second gate bottom insulating layer 503. The second gate top conductive layer 507 may be disposed on the second gate bottom conductive layer 505. The second gate filler layer 509 may be disposed on the second gate top conductive layer 507.

With reference to FIG. 33, the capacitor structure 601 may include a capacitor bottom insulating layer 603, a capacitor bottom conductive layer 605, a capacitor top insulating layer 607, a capacitor top conductive layer 609, and a capacitor filler layer 611. The capacitor bottom insulating layer 603 may be inwardly disposed in the first insulating film 215 and above the third active region 109. The capacitor bottom conductive layer 605 may be disposed on the capacitor bottom insulating layer 603. The capacitor top insulating layer 607 may be disposed on the capacitor bottom conductive layer 605. The capacitor top conductive layer 609 may be disposed on the capacitor top insulating layer 607. The capacitor filler layer 611 may be disposed on the capacitor top conductive layer 609.

The first gate bottom insulating layer 403, the second gate bottom insulating layer 503, and the capacitor bottom insulating layer 603 may be formed from the first insulating layer 301. The second gate bottom conductive layer 505 and the capacitor bottom conductive layer 605 may be formed from the first conductive layer 303. The first gate top insulating layer 405 and the capacitor top insulating layer 607 may be formed from the second insulating layer 305. The first gate top conductive layer 407, the second gate top conductive layer 507, and the capacitor top conductive layer 609 may be formed from the second conductive layer 307. The first gate filler layer 409, the second gate filler layer 509, and the capacitor filler layer 611 may be formed from the filler layer 309.

Figure 34:
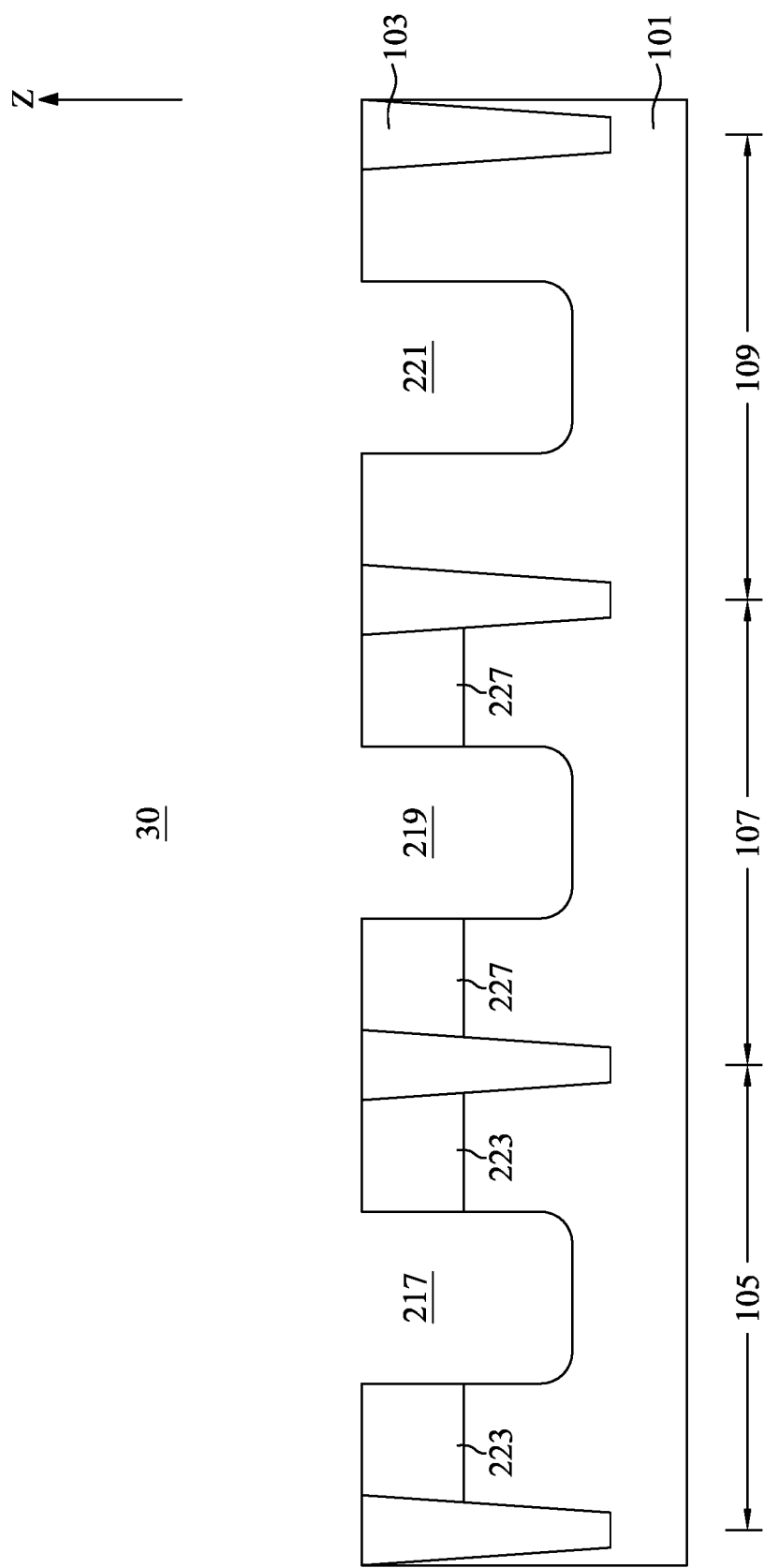
FIGS. 34 to 36 illustrate, in schematic cross-sectional diagrams, a flow of fabricating a semiconductor device in accordance with another embodiment of the present disclosure.
Figure 35:
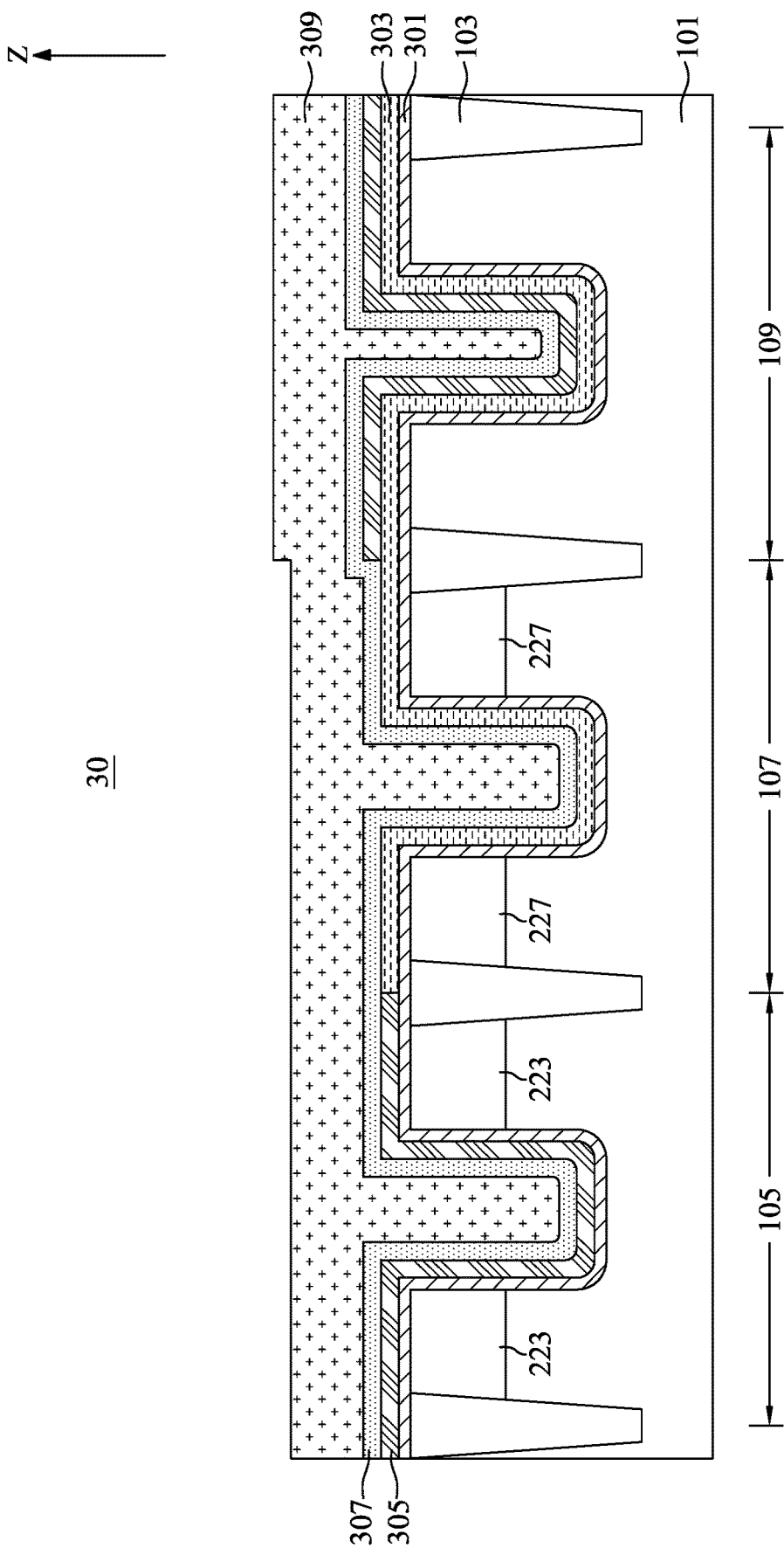
Figure 36:
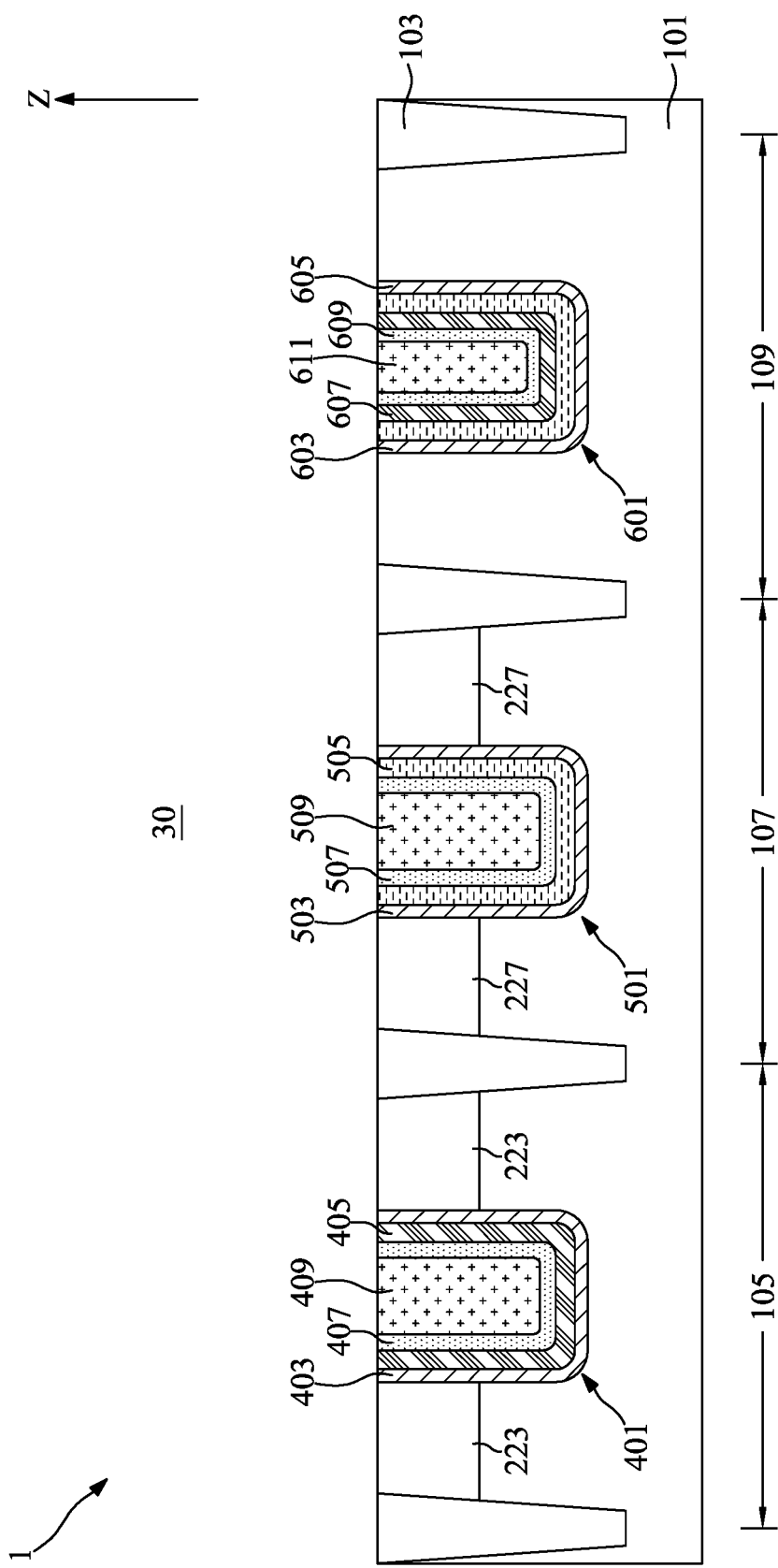

FIGS. 34 to 36 illustrate, in schematic cross-sectional diagrams, a flow of fabricating a semiconductor device 1 in accordance with another embodiment of the present disclosure.

With reference to FIG. 34, the plurality of recesses may be formed in the substrate 101. The first recess 217 may be disposed in the first active region 105. The second recess 219 may be disposed in the second active region 107. The third recess 221 may be disposed in the third active region 109. With reference to FIG. 35, the first insulating layer 301, the first conductive layer 303, the second insulating layer 305, the second conductive layer 307, and the filler layer 309 may be deposited in the first recess 217, the second recess 219, and the third recess 221 by a procedure similar to that illustrated in FIGS. 24 to 32. With reference to FIG. 36, a planarization process, such as chemical mechanical polishing, may be performed until the top surfaces of the substrate 101 are exposed. The first gate structure 401, the second gate structure 501, and the capacitor structure 601 may be concurrently formed after the planarization process.

According to the design of the semiconductor device of the present disclosure, the thickness and the materials for elements of the first gate structure 401, the second gate structure 501, and the capacitor structure 601 may be the same; therefore, such elements may be concurrently fabricated. As a result, a complexity of fabricating the semiconductor device may be reduced.

One aspect of the present disclosure provides a semiconductor device including a first gate structure comprising a first gate bottom insulating layer inwardly positioned, a first gate top insulating layer positioned on the first gate bottom insulating layer, a first gate top conductive layer positioned on the first gate top insulating layer, and a first gate filler layer positioned on the first gate top conductive layer; and a capacitor structure comprising a capacitor bottom insulating layer inwardly positioned, a capacitor bottom conductive layer positioned on the capacitor bottom insulating layer, a capacitor top insulating layer positioned on the capacitor bottom conductive layer, a capacitor top conductive layer positioned on the capacitor top insulating layer, and a capacitor filler layer positioned on the capacitor top conductive layer. The first gate bottom insulating layer is formed of a same material as the capacitor bottom insulating layer.

Another aspect of the present disclosure provides a method for fabricating a semiconductor device including concurrently forming a first gate structure and a capacitor structure. The first gate structure comprises a first gate bottom insulating layer inwardly positioned, a first gate top insulating layer positioned on the first gate bottom insulating layer, a first gate top conductive layer positioned on the first gate top insulating layer, and a first gate filler layer positioned on the first gate top conductive layer; and the capacitor structure comprises a capacitor bottom insulating layer inwardly positioned, a capacitor bottom conductive layer positioned on the capacitor bottom insulating layer, a capacitor top insulating layer positioned on the capacitor bottom conductive layer, a capacitor top conductive layer positioned on the capacitor top insulating layer, and a capacitor filler layer positioned on the capacitor top conductive layer. The first gate bottom insulating layer is formed of a same material as the capacitor bottom insulating layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a first gate structure comprising a first gate bottom insulating layer inwardly positioned, a first gate top insulating layer positioned on the first gate bottom insulating layer, a first gate top conductive layer positioned on the first gate top insulating layer, and a first gate filler layer positioned on the first gate top conductive layer; and
   a capacitor structure comprising a capacitor bottom insulating layer inwardly positioned, a capacitor bottom conductive layer positioned on the capacitor bottom insulating layer, a capacitor top insulating layer positioned on the capacitor bottom conductive layer, a capacitor top conductive layer positioned on the capacitor top insulating layer, and a capacitor filler layer positioned on the capacitor top conductive layer;
   wherein the first gate bottom insulating layer is formed of a same material as the capacitor bottom insulating layer.

2. The semiconductor device of claim 1, further comprising a second gate structure positioned adjacent to the first gate structure.

3. The semiconductor device of claim 2, wherein the second gate structure comprises a second gate bottom insulating layer inwardly positioned, a second gate bottom conductive layer positioned on the second gate bottom insulating layer, a second gate top conductive layer positioned on the second gate bottom conductive layer, and a second gate filler layer positioned on the second gate top conductive layer, wherein the second gate bottom insulating layer is formed of a same material as the first gate bottom insulating layer.

4. The semiconductor device of claim 3, further comprising a substrate and a first insulating film positioned on the substrate, wherein the first gate structure, the second gate structure, and the capacitor structure are positioned in the first insulating film.

5. The semiconductor device of claim 4, further comprising an isolation layer positioned in the substrate and defining a first active region, a second active region positioned adjacent to the first active region, and a third active region positioned adjacent to the second active region.

6. The semiconductor device of claim 5, further comprising a plurality of first doped subregions positioned in the first active region and respectively adjacent to two sides of a bottom of the first gate structure.

7. The semiconductor device of claim 6, further comprising a plurality of first stress regions respectively positioned adjacent to the plurality of first doped subregions.

8. The semiconductor device of claim 3, wherein the second gate structure further comprises a second gate top insulating layer positioned between the second gate bottom conductive layer and second gate top conductive layer.

9. The semiconductor device of claim 8, wherein a thickness of the second gate top insulating layer is less than or equal to a thickness of the first gate top insulating layer.

10. The semiconductor device of claim 1, wherein a thickness of the first gate bottom insulating layer is the same as a thickness of the capacitor bottom insulating layer.

11. The semiconductor device of claim 10, wherein a thickness of the first gate top insulating layer is the same as a thickness of the capacitor top insulating layer, and the first gate top insulating layer is formed of a same material as the capacitor top insulating layer.

12. The semiconductor device of claim 11, wherein a thickness of the first gate top conductive layer is the same as a thickness of the capacitor top conductive layer, and the first gate top conductive layer is formed of a same material as the capacitor top conductive layer.

13. The semiconductor device of claim 3, further comprising a substrate, wherein the first gate structure, the second gate structure, and the capacitor structure are positioned in the substrate.

14. A method for fabricating a semiconductor device, comprising:
    concurrently forming a first gate structure and a capacitor structure;
    wherein the first gate structure comprises a first gate bottom insulating layer inwardly positioned, a first gate top insulating layer positioned on the first gate bottom insulating layer, a first gate top conductive layer positioned on the first gate top insulating layer, and a first gate filler layer positioned on the first gate top conductive layer;
    the capacitor structure comprises a capacitor bottom insulating layer inwardly positioned, a capacitor bottom conductive layer positioned on the capacitor bottom insulating layer, a capacitor top insulating layer positioned on the capacitor bottom conductive layer, a capacitor top conductive layer positioned on the capacitor top insulating layer, and a capacitor filler layer positioned on the capacitor top conductive layer; and
    the first gate bottom insulating layer is formed of a same material as the capacitor bottom insulating layer.

15. The method for fabricating the semiconductor device of claim 14, further comprising forming a second gate structure concurrently with the first gate structure and the capacitor structure, wherein the second gate structure is positioned adjacent to the first gate structure.

16. The method for fabricating the semiconductor device of claim 15, wherein the second gate structure comprises a second gate bottom insulating layer inwardly positioned, a second gate bottom conductive layer positioned on the second gate bottom insulating layer, a second gate top conductive layer positioned on the second gate bottom conductive layer, and a second gate filler layer positioned on the second gate top conductive layer; wherein the second gate bottom insulating layer is formed of a same material as the first gate bottom insulating layer.

17. The method for fabricating the semiconductor device of claim 16, further comprising a substrate and a first insulating film positioned on the substrate, wherein the first gate structure, the second gate structure, and the capacitor structure are positioned in the first insulating film.

18. The method for fabricating the semiconductor device of claim 16, further comprising a substrate, wherein the first gate structure, the second gate structure, and the capacitor structure are positioned in the substrate.

19. The method for fabricating the semiconductor device of claim 17, wherein a thickness of the first gate bottom insulating layer is the same as a thickness of the capacitor bottom insulating layer.

20. The method for fabricating the semiconductor device of claim 19, wherein a thickness of the first gate top insulating layer is the same as a thickness of the capacitor top insulating layer, and the first gate top insulating layer is formed of a same material as the capacitor top insulating layer.

* * * * *